United States Patent
Zhao et al.

(10) Patent No.: US 11,678,583 B2
(45) Date of Patent: Jun. 13, 2023

(54) METHOD OF MANUFACTURING MAGNETIC TUNNEL JUNCTION AND MAGNETIC TUNNEL JUNCTION

(71) Applicant: Hitachi High-Tech Corporation, Tokyo (JP)

(72) Inventors: Yu Zhao, Tokyo (JP); Katsuya Miura, Tokyo (JP); Hirotaka Hamamura, Tokyo (JP); Masaki Yamada, Tokyo (JP); Kiyohiko Sato, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/590,122

(22) Filed: Feb. 1, 2022

(65) Prior Publication Data

US 2022/0158088 A1  May 19, 2022

Related U.S. Application Data

(62) Division of application No. 16/489,838, filed as application No. PCT/JP2019/000101 on Jan. 7, 2019, now Pat. No. 11,276,816.

(30) Foreign Application Priority Data

Jun. 20, 2018  (JP) .............................. JP2018-116619

(51) Int. Cl.
*H01L 21/3065* (2006.01)
*H01L 43/12* (2006.01)
(Continued)

(52) U.S. Cl.
CPC .......... *H01L 43/12* (2013.01); *H01L 21/3065* (2013.01); *H01L 27/222* (2013.01); *H01L 43/02* (2013.01); *H01L 43/10* (2013.01)

(58) Field of Classification Search
None
See application file for complete search history.

(56) References Cited

U.S. PATENT DOCUMENTS

| RE40,951 E | 11/2009 | Kodaira et al. |
| 11,276,816 B2 * | 3/2022 | Zhao ....................... H01L 43/10 |

(Continued)

FOREIGN PATENT DOCUMENTS

| JP | 2005042143 A | 2/2005 |
| JP | 2009253303 A | 10/2009 |

(Continued)

OTHER PUBLICATIONS

Chen, J.K.-C. et al., "Directional Etch of Magnetic and Noble Metals II. Organic Chemical Vapor Etch", Journal of Vacuum Science & Technology A., Vacuum Surfaces and Films 35, 031304 (2017).

(Continued)

*Primary Examiner* — Jack S Chen
(74) *Attorney, Agent, or Firm* — Miles & Stockbridge, P.C.

(57) ABSTRACT

Provided is a method of manufacturing a magnetic tunnel junction that simultaneously realizes removal of oxides on side walls of a magnetic layer and formation of a protective film and prevents deterioration of magnetic characteristics. The method includes: a first step 802 of etching a stacked film including a first magnetic layer, a MgO barrier layer, and a second magnetic layer stacked in order by plasma etching using an oxidizing gas to form the magnetic tunnel junction; and a second step 803 of simultaneously introducing an organic acid gas which is an n-valent acid and a precursor gas having a corresponding metal element valence of m, to form a first protective film on side walls of the magnetic tunnel junction. In the second step, the precursor (Continued)

gas is introduced at a molar ratio of n/m or more with respect to 1 mole of the organic acid gas introduced.

2 Claims, 17 Drawing Sheets

(51) Int. Cl.
    *H01L 27/22*     (2006.01)
    *H01L 43/02*     (2006.01)
    *H01L 43/10*     (2006.01)

(56) References Cited

U.S. PATENT DOCUMENTS

| | | |
|---|---|---|
| 2009/0256220 A1 | 10/2009 | Horng et al. |
| 2009/0314740 A1 | 12/2009 | Ikemoto et al. |
| 2010/0102407 A1 | 4/2010 | Kajiyama et al. |
| 2011/0235217 A1 | 9/2011 | Chen et al. |
| 2014/0159176 A1 | 6/2014 | Nomachi |
| 2014/0295580 A1 | 10/2014 | Hara |
| 2015/0050750 A1 | 2/2015 | Sone et al. |
| 2015/0214474 A1 | 7/2015 | Nishimura et al. |
| 2017/0133233 A1 | 5/2017 | Sato et al. |
| 2017/0194560 A1 | 7/2017 | Satake et al. |
| 2020/0006644 A1 | 1/2020 | Zhao et al. |

FOREIGN PATENT DOCUMENTS

| | | |
|---|---|---|
| JP | 2009302550 A | 12/2009 |
| JP | 2010103303 A | 5/2010 |
| JP | 2013524515 A | 6/2013 |
| JP | 2013140891 A | 7/2013 |
| JP | 2014212310 A | 11/2014 |
| JP | 2017123355 A | 7/2017 |
| WO | 2009107485 A1 | 9/2009 |
| WO | 2013161769 A1 | 10/2013 |
| WO | 2014034666 A1 | 3/2014 |
| WO | 2016013418 A1 | 1/2016 |

OTHER PUBLICATIONS

Chen, J.K.-C., et al.; "Ion Beam Assisted Organic Chemical Vapor Etch of Magnetic Thin Films"; Journal of Vacuum Science & Technology A: Vacuum, Surfaces, and Films 35, 031304 (2017).

International Search Report dated Mar. 26, 2019, for PCT/JP2019/000101.

* cited by examiner

[FIG. 1]
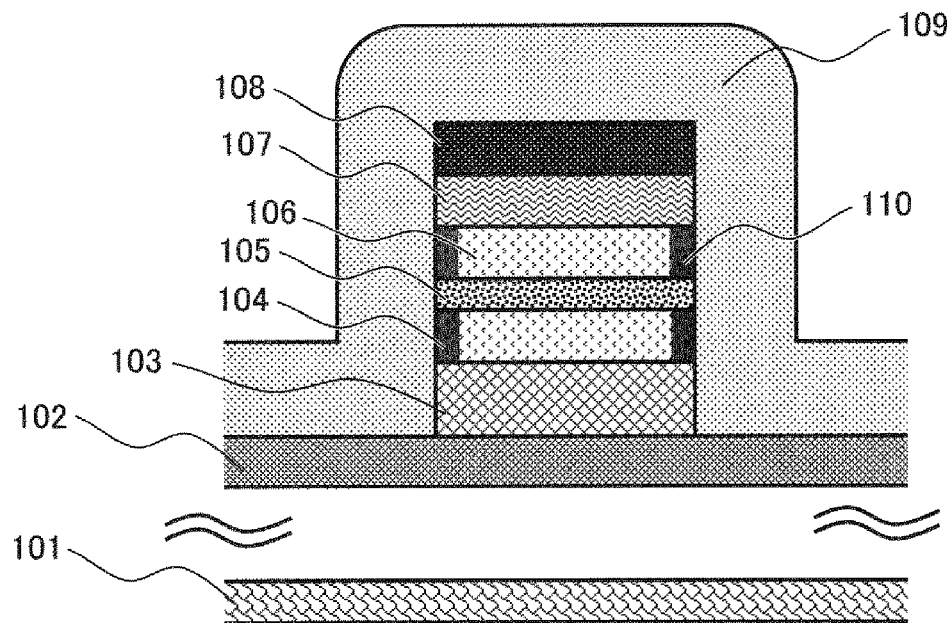
[FIG. 2]
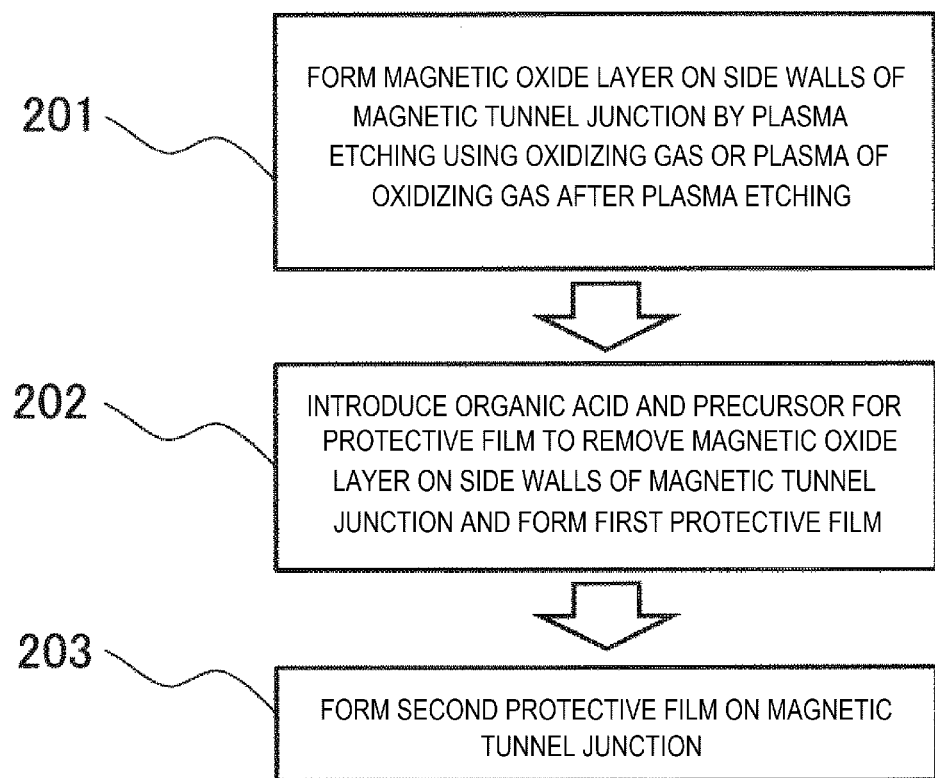

[FIG. 3A]
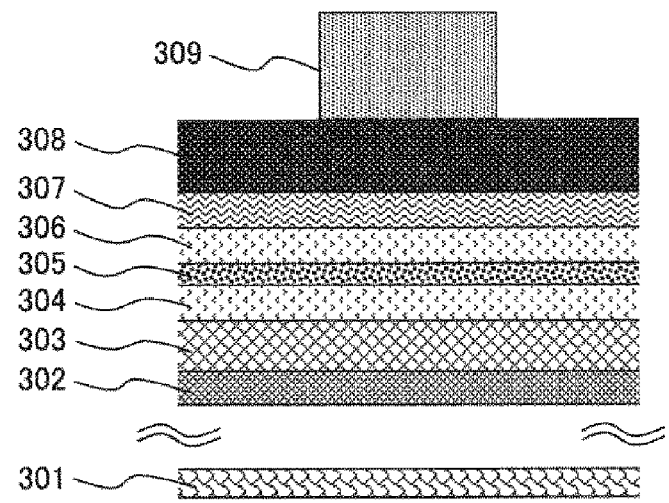
[FIG. 3B]
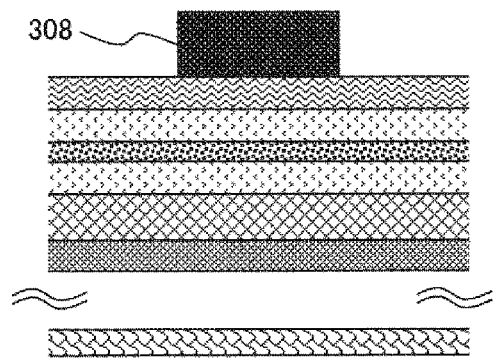
[FIG. 3C]
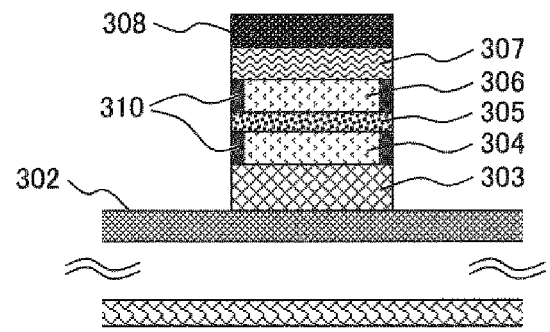

[FIG. 3D]
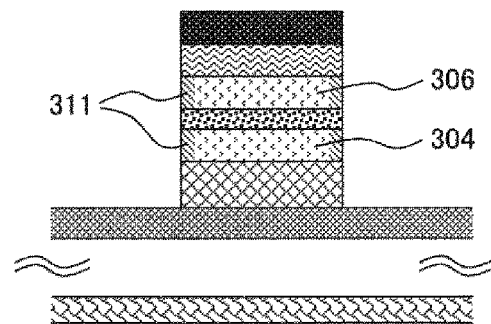
[FIG. 3E]
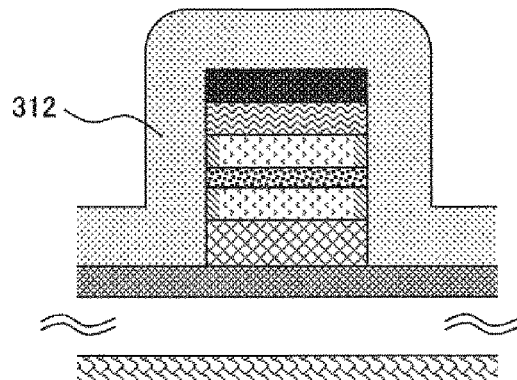
[FIG. 3F]
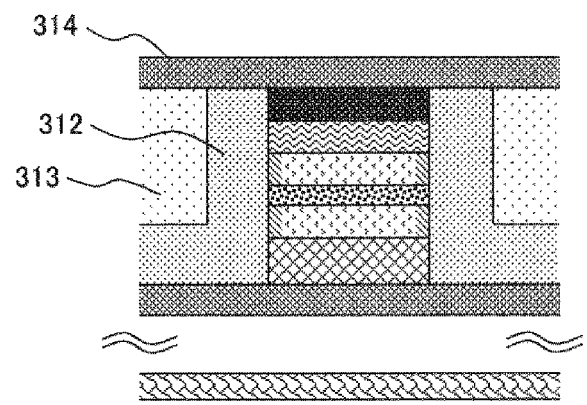

[FIG. 4]

| ORGANIC ACIDS |
|---|
| GASES CONTAINING CARBOXYL GROUP: FORMIC ACID (HCOOH), ACETIC ACID ($CH_3COOH$), PROPIONIC ACID ($CH_3CH_2COOH$), AND THE LIKE |
| GASES CONTAINING ALDEHYDE GROUP: FORMALDEHYDE (HCHO), ACETALDEHYDE ($CH_3CHO$), PROPIONALDEHYDE ($C_2H_5CHO$), AND THE LIKE |
| OTHER GASES: ACETYLACETONE ($C_5H_8O_2$) AND THE LIKE |

[FIG. 5]

| METAL ORGANICS | BOILING POINT °C |
|---|---|
| $Fe(acac)_3$ | 161 |
| $Fe(CO)_5$ | 103 |
| $Fe(hfac)_3$ | 81 |
| $Fe(tfac)_3$ | 121 |
| $Fe(tmhd)_3$ | 150 |
| $Co(acac)_2$ | 181 |
| $Co(acac)_3$ | 170 |
| $Co(hfac)_3$ | 90 |
| $Co(tfac)_3$ | 131 |
| $Co(tmhd)_3$ | 161 |
| $Co(tmhd)_2$ | 171 | acac : acetylacetone
hfac : hexafluoro acetylacetone
tfac : trifluoro acetylacetone
tmhd : 2,2,6,6-tetramethyl-3,5-heptanedionate

[FIG. 6]

| PRECURSORS |
|---|
| • $Al_2O_3$ PRECURSORS : $Al(OC_2H_5)_3$, $Al(i-C_4H_9)_3$, $Al(i-OC_3H_7)_3$, $Al(OCH_3)_3$, $Al(CH_3)_3$, $Al(acac)_3$, $Al(hfac)_3$ , AND THE LIKE<br>• $TiO_2$ PRECURSORS : $Ti(i-OC_3H_7)_4$, $Ti(n-OC_4H_9)_4$, $Ti(acac)_4$, $Ti(tmhd)_3$, AND THE LIKE<br>• $SiO_2$ PRECURSORS : $Si(CH_3)_2$, $Si(OC_2H_5)_2$, $Si(CH_3)_4$ , AND THE LIKE<br>• $Ta_2O_5$ PRECURSORS : $Ta(OC_2H_5)_5$, $Ta(i-OC_3H_7)_5$ , AND THE LIKE<br>• PRECURSOR SUCH AS $HfO_2$, $ZrO_2$ |

[FIG. 7]

| VALENCE OF METAL ELEMENT CORRESPONDING TO PRECURSOR | METAL ELEMENT | PRECURSOR/ORGANIC ACID (RATIO) |
|---|---|---|
| +2 | Mg, AND THE LIKE | >1/2 |
| +3 | Al, AND THE LIKE | >1/3 |
| +4 | Si, Ti, Hf, Zr, AND THE LIKE | >1/4 |
| +5 | Ta, AND THE LIKE | >1/5 |

[FIG. 8]
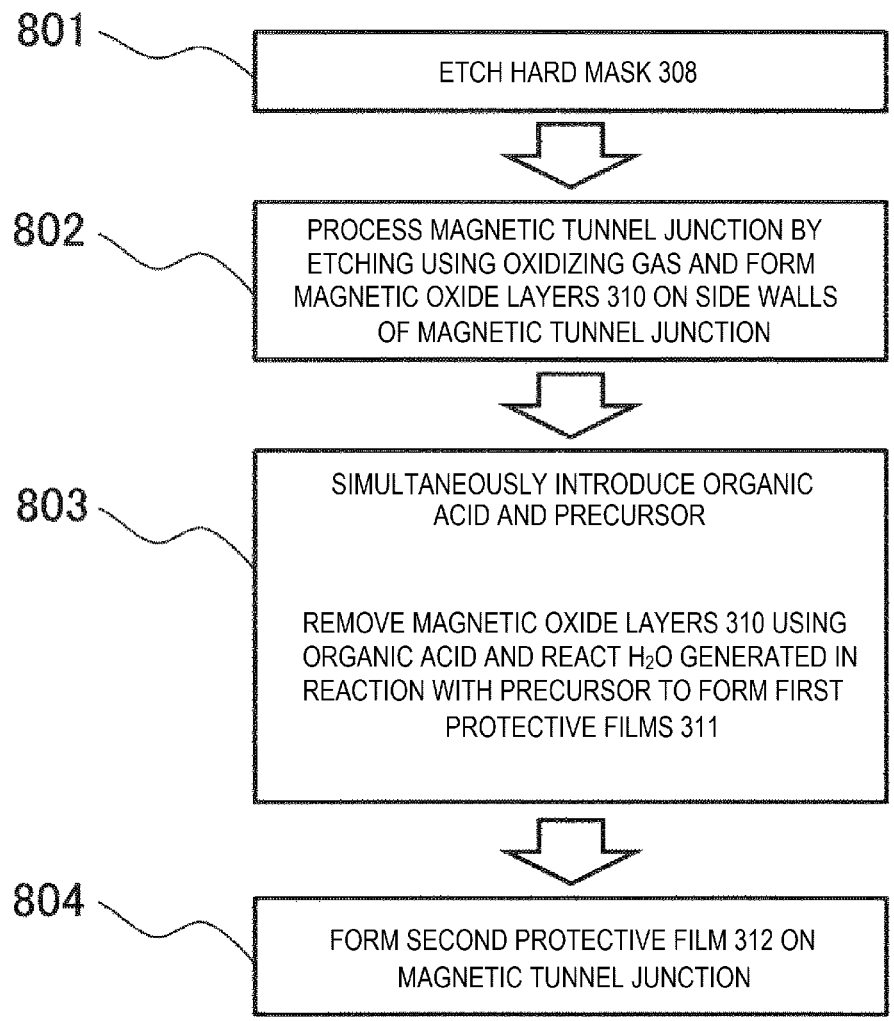

[FIG. 9]
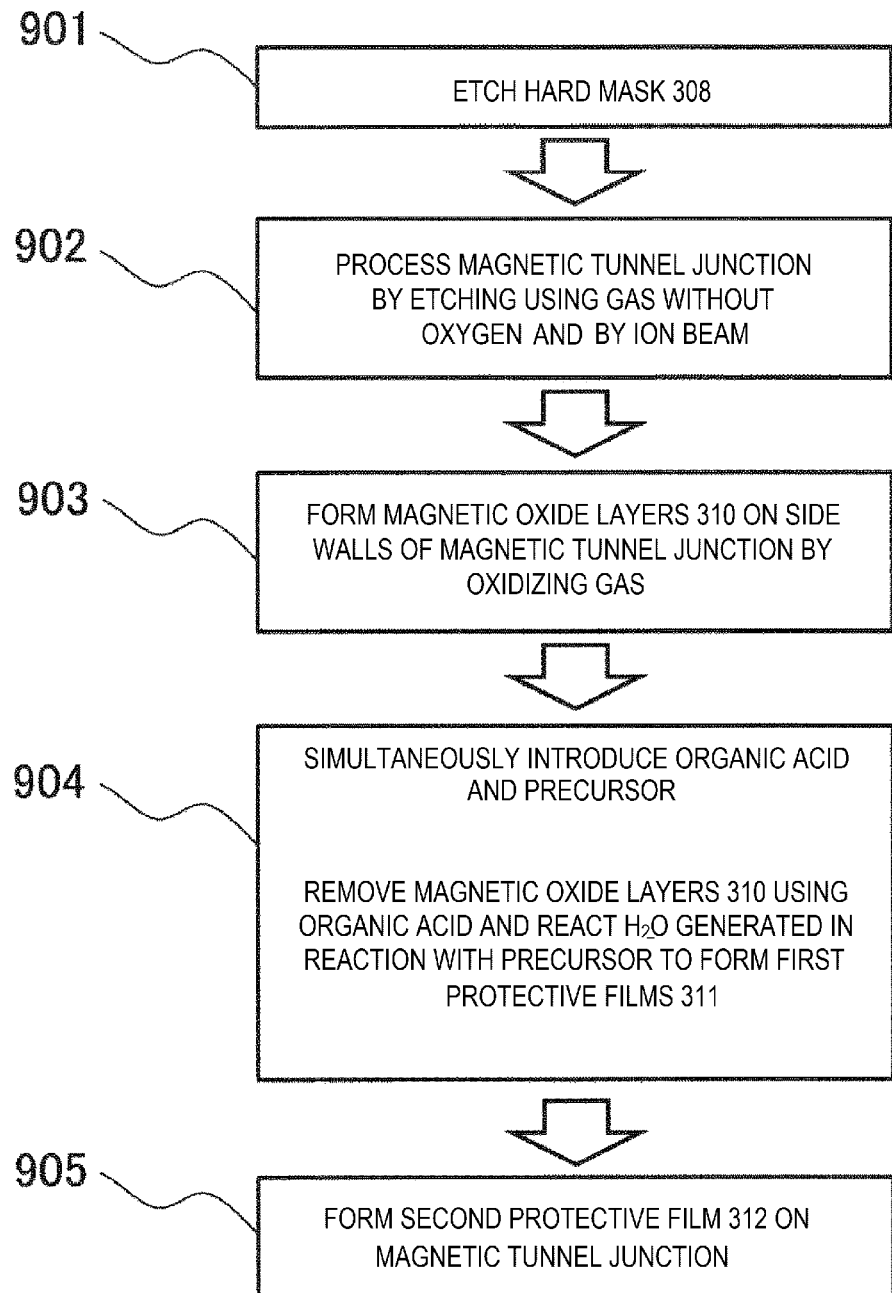

[FIG. 10]
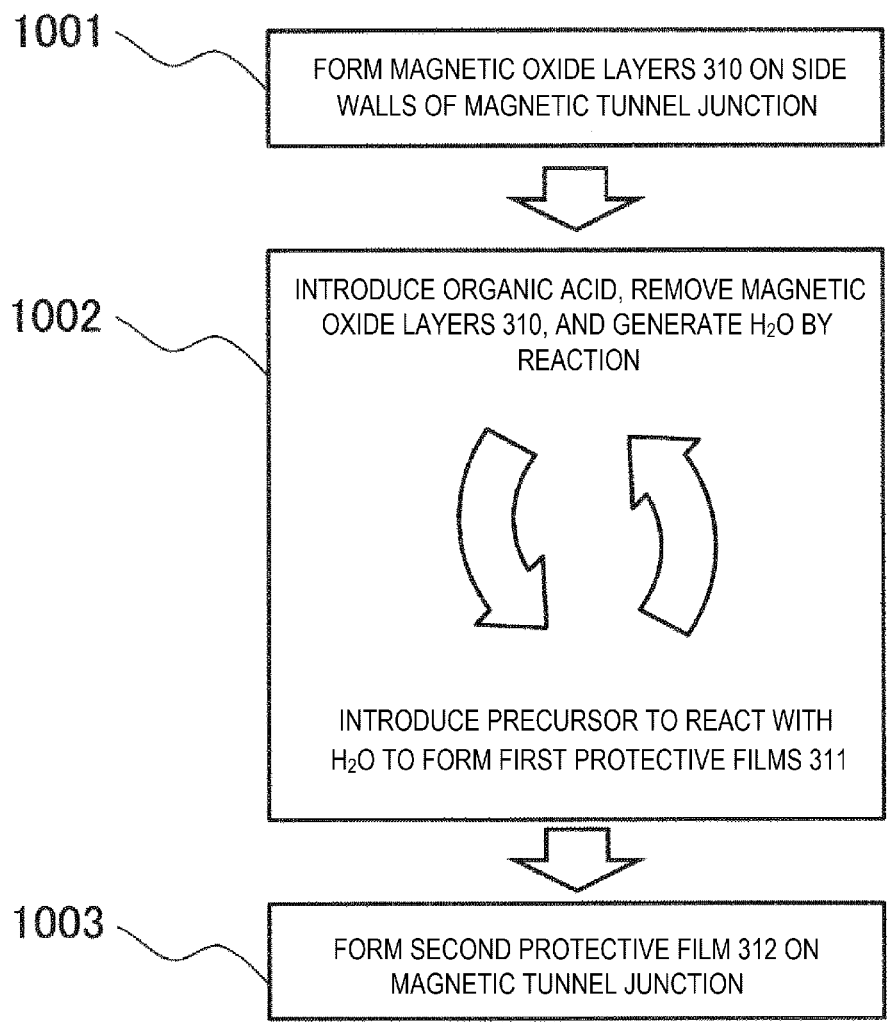

[FIG. 11]
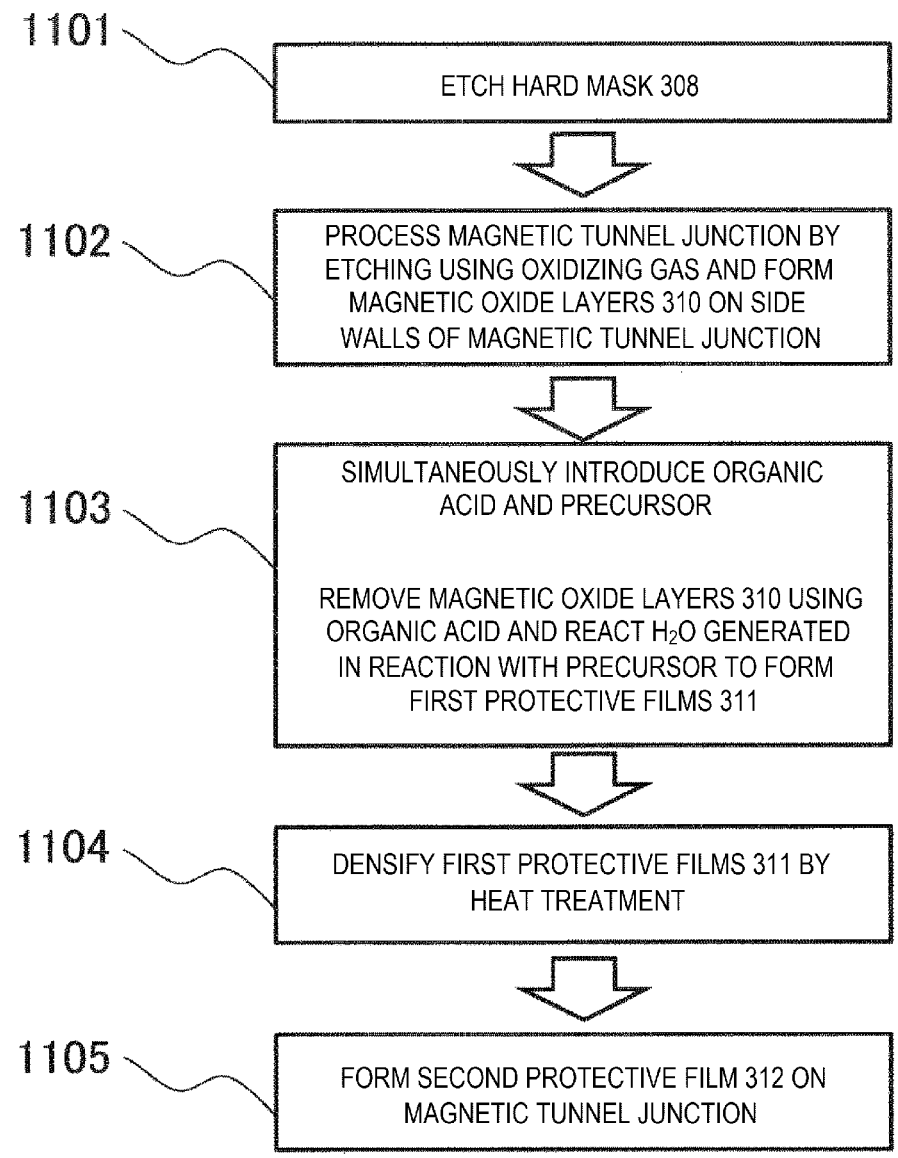

[FIG. 12]
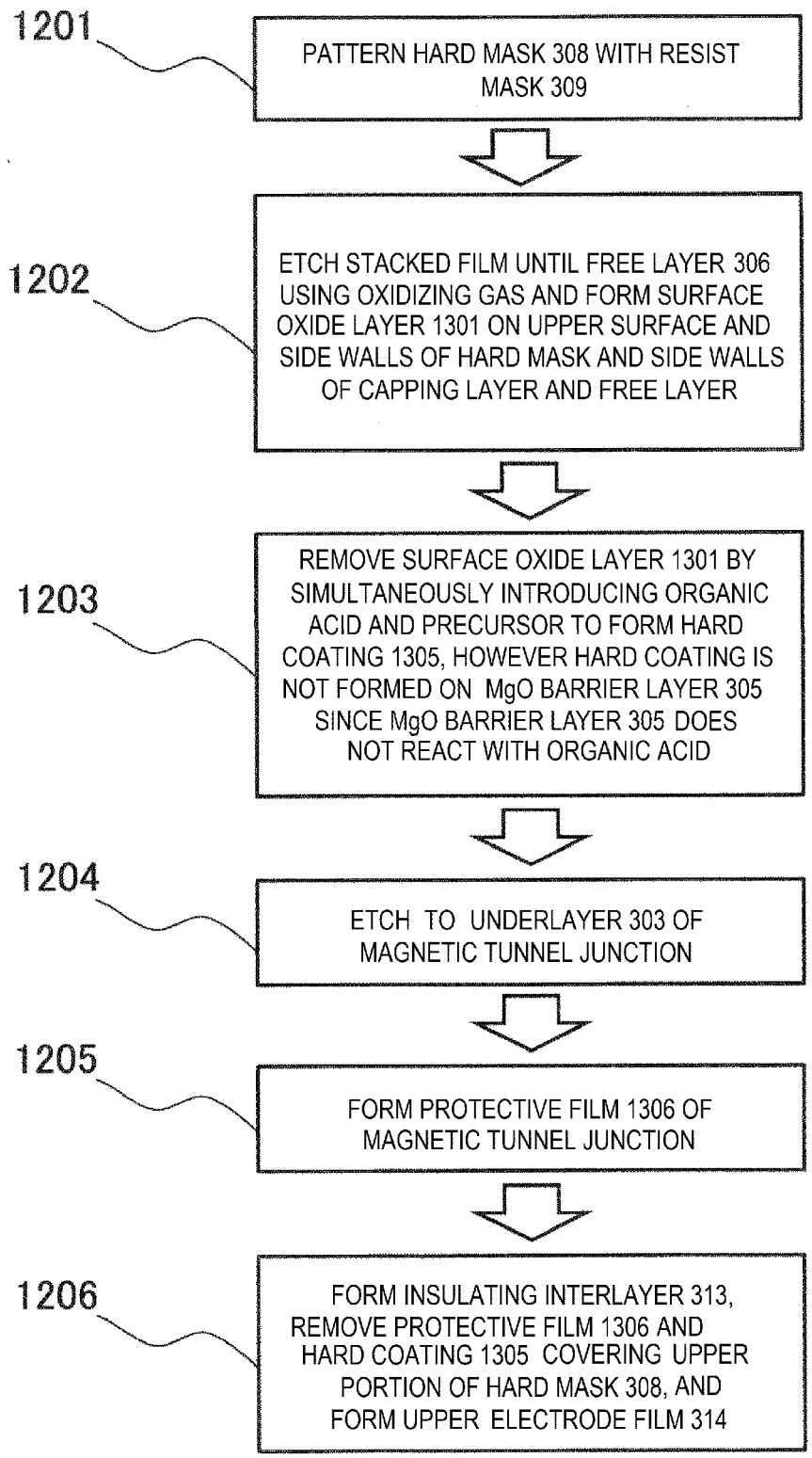

[FIG. 13A]
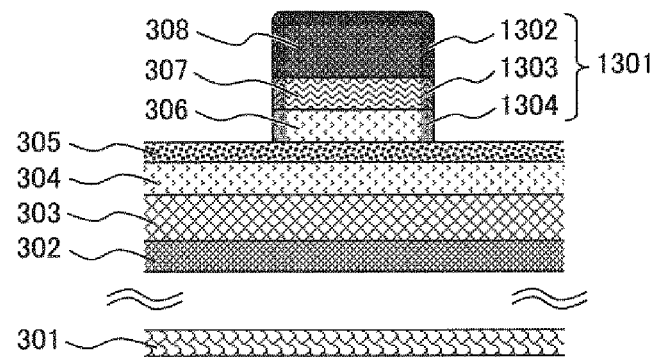
[FIG. 13B]
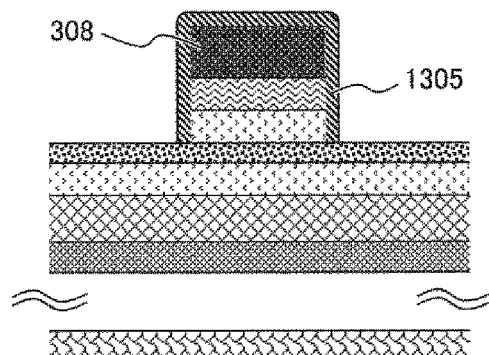
[FIG. 13C]
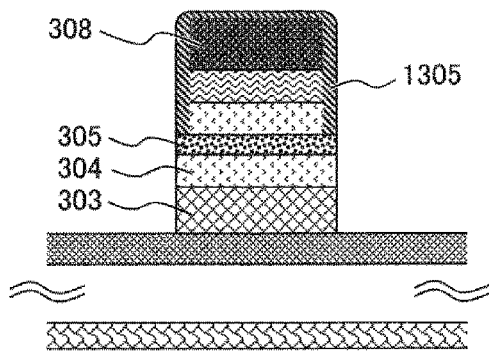

[FIG. 13D]
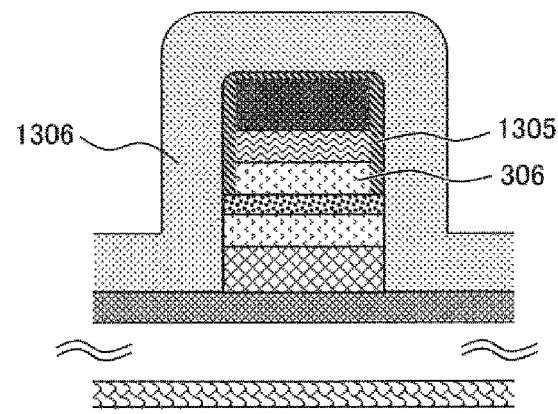
[FIG. 13E]
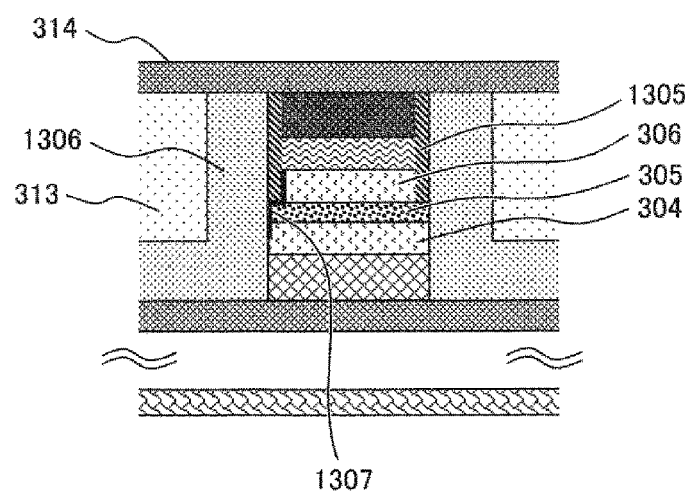

[FIG. 14]
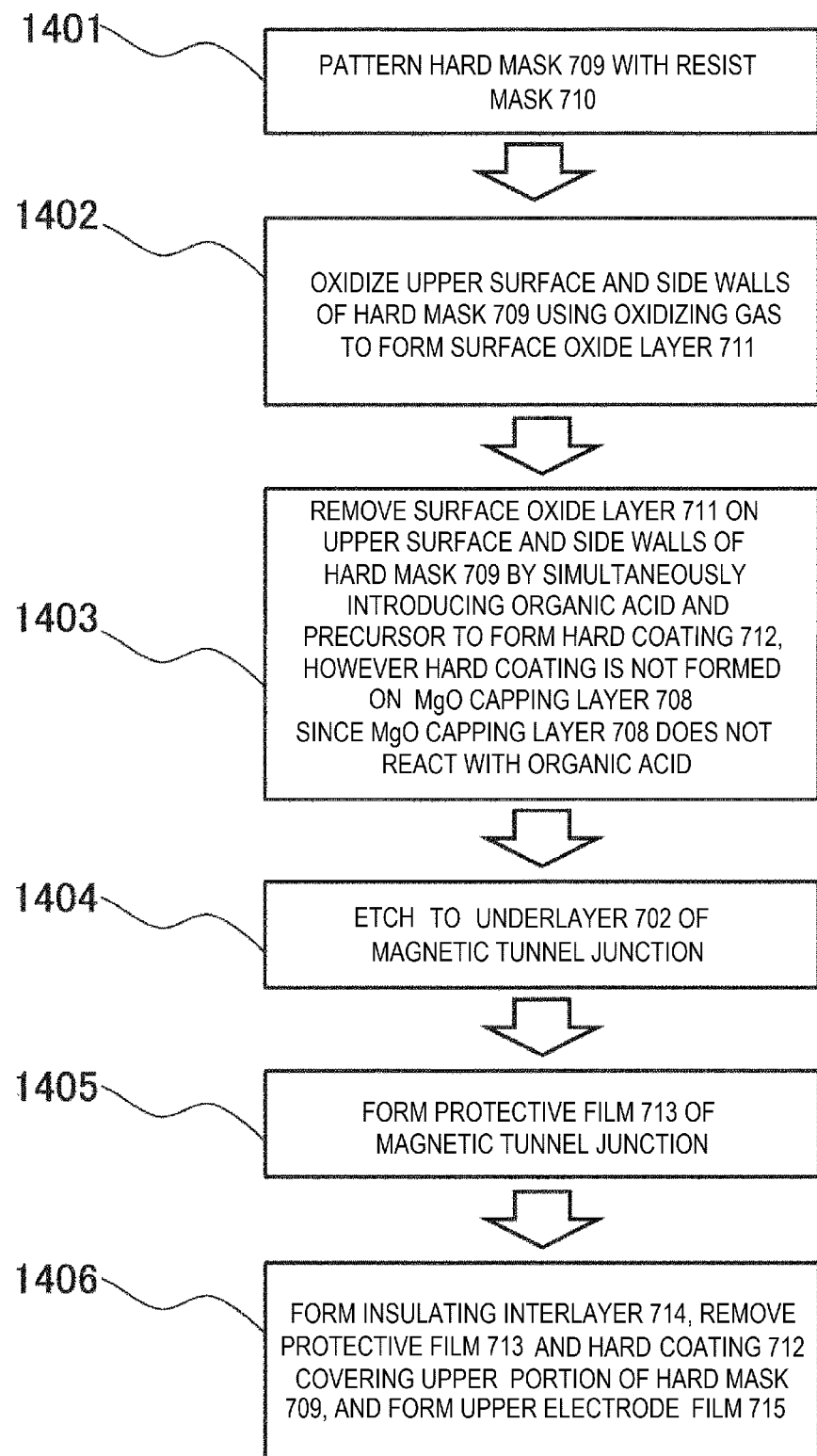

[FIG. 15A]
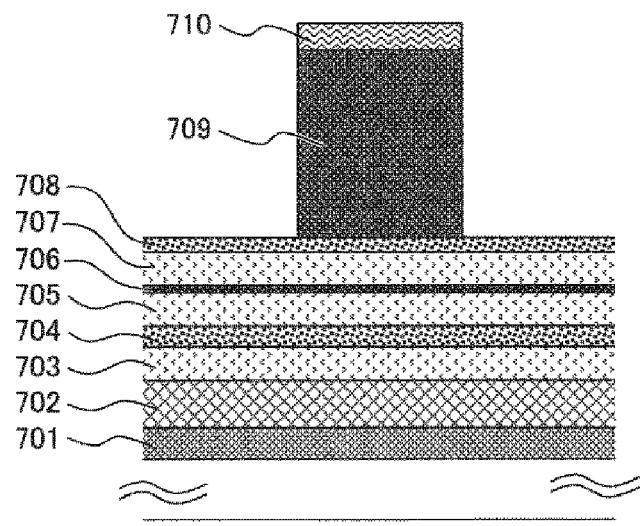
[FIG. 15B]
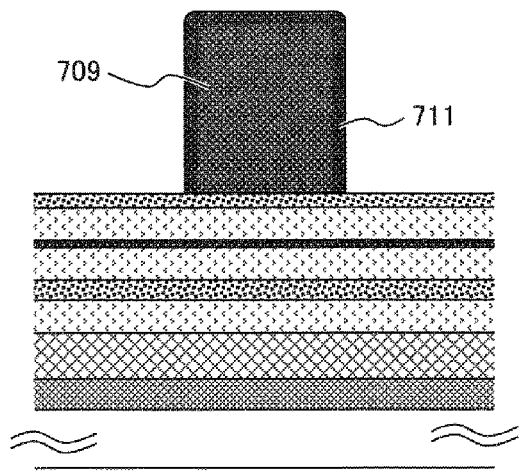

[FIG. 15C]
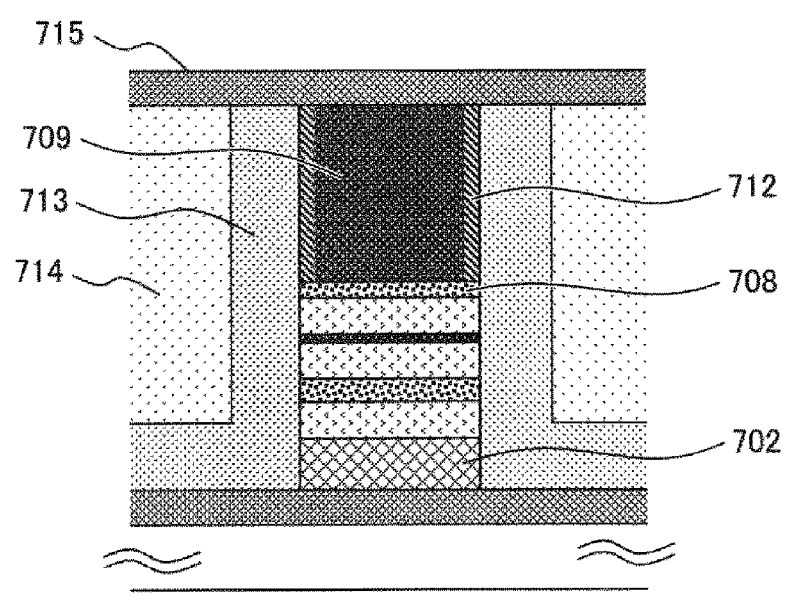

[FIG. 16]
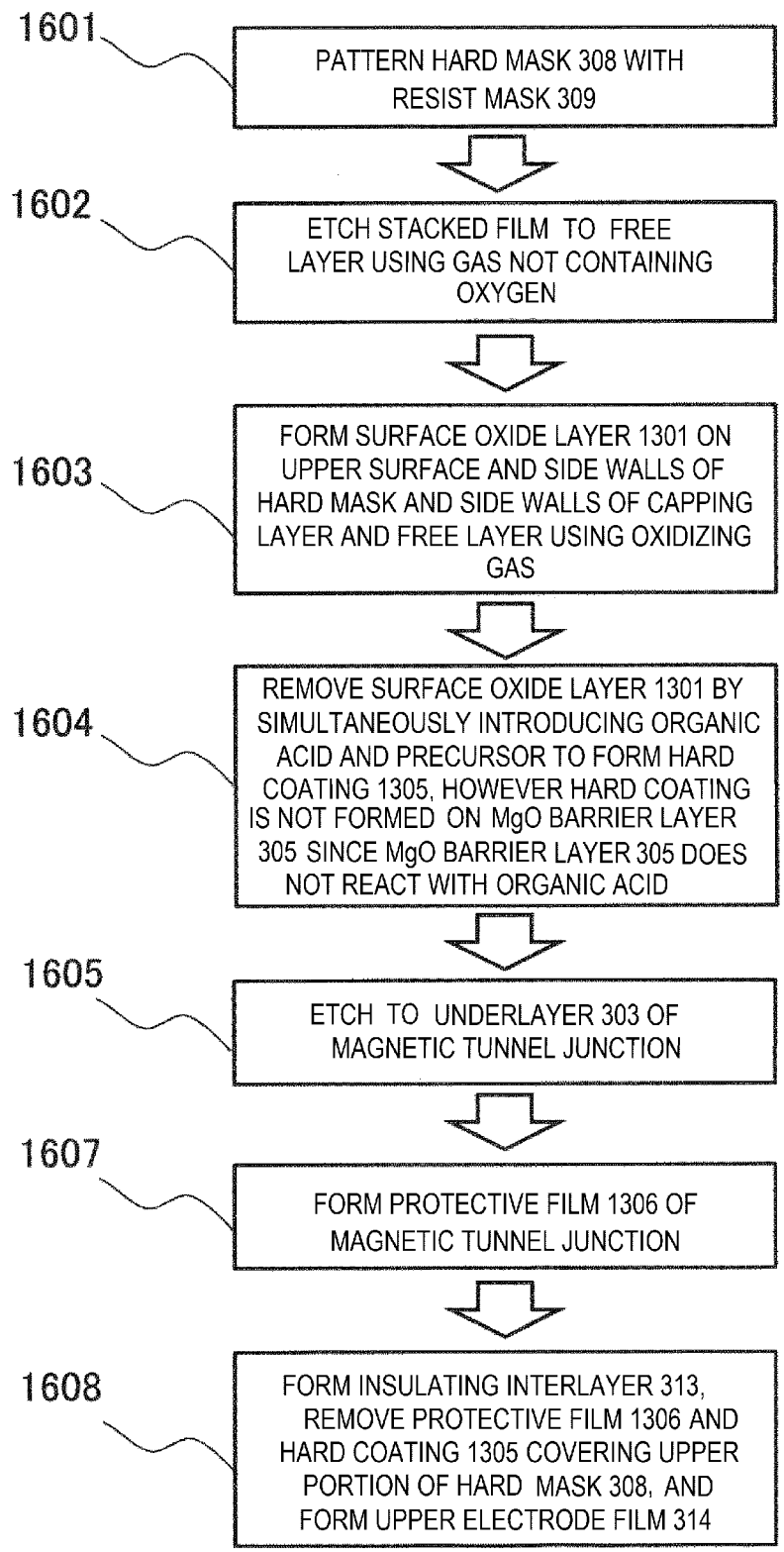

[FIG. 17]
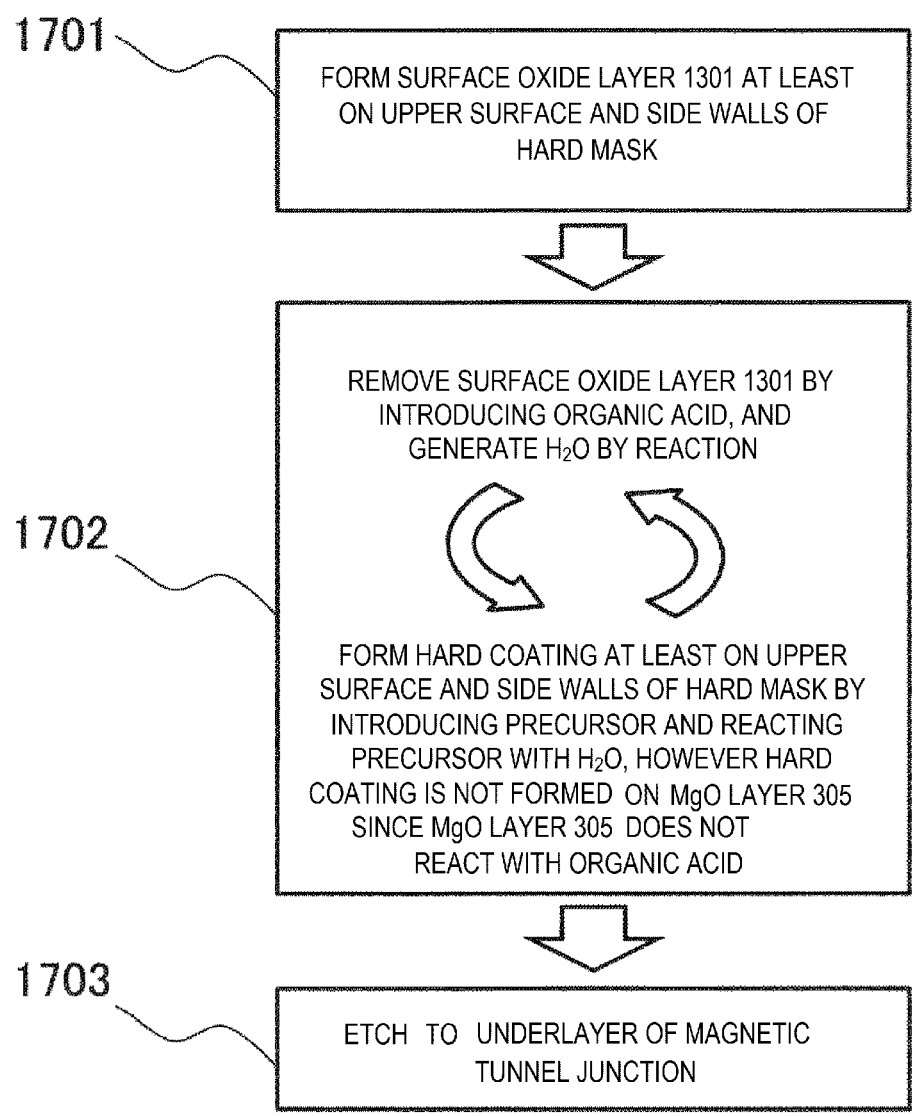

METHOD OF MANUFACTURING MAGNETIC TUNNEL JUNCTION AND MAGNETIC TUNNEL JUNCTION

TECHNICAL FIELD

The present invention relates to a method manufacturing of a magnetic tunnel junction (MTJ element) and a magnetic tunnel junction.

BACKGROUND ART

In recent years, a magnetoresistive random access memory (MRAM) is expected to be used as a non-volatile memory that operates with a low power consumption and a high speed. A magnetic tunnel junction, which is a basic structure of the magnetoresistive random access memory, has a stacked structure in which a barrier layer is sandwiched between a free layer, which is a magnetic layer whose magnetization direction can be reversed by an external magnetic field or spin transfer, and a fixed layer, which is a magnetic layer whose magnetization direction is fixed. In the magnetic tunnel junction, the resistance is low when the magnetization directions of the free layer and the fixed layer are parallel, and the resistance is high when the magnetization directions of the free layer and the fixed layer are antiparallel. A memory in which the resistance difference of the magnetic tunnel junction corresponds to bit information of "0" and "1" is a magnetoresistive random access memory.

As shown in FIG. 1, a cross section of the magnetic tunnel junction has a stacked structure including a Si substrate 101, an electrode film 102, an underlayer 103 for controlling the crystallinity of a fixed layer and stabilizing the magnetization of the fixed layer, a fixed layer 104 made of a magnetic material containing elements such as Co and Fe, a MgO barrier layer 105, a free layer 106 made of a magnetic material containing elements such as Co and Fe, a capping layer 107 for protecting the free layer, a hard mask 108, and a protective film 109.

In the manufacture of the magnetic tunnel junction, it is necessary to utilize a technique of fine etching a stacked film including a magnetic layer containing elements such as Fe and Co used in the free layer 106 and the fixed layer 104 and the MgO barrier layer 105 by dry etching. In order to prevent deterioration of characteristics of the magnetic tunnel junction due to the moisture or oxygen in the atmosphere, a step of forming a protective film on the magnetic tunnel junction formed by dry etching is also necessary.

Here, the method of fine etching the stacked film by the dry etching includes two methods, that is, a method of using ion beam etching and a method of using plasma etching. In the ion beam etching, a plasmatized rare gas such as He, Ne, Ar, Kr, or Xe is accelerated by applying a bias thereto and the stacked film is irradiated with the accelerated rare gas. Since the chemically inert rare gas is used, it is advantageous that the gas for treatment does not chemically react with the free layer 106, the fixed layer 104, and the MgO barrier layer 105 of the magnetic tunnel junction during the ion beam etching. However, when the miniaturization of the MRAM proceeds and the distance between the magnetic tunnel junctions becomes narrow, it can be expected that element isolation of the magnetic tunnel junctions is difficult due to the shadowing effect, and it is difficult to use the magnetic tunnel junction in the future.

In contrast, in the plasma etching, a reactive gas such as hydrogen, nitrogen, or oxygen is plasmatized, the stacked film is irradiated with the reactive gas, and the etching is realized by the reaction with the stacked film. This technique is directed to high integration as compared with the ion beam etching. However, in the case of plasma etching, when using plasma produced by using an oxidizing gas or a reducing gas, the magnetic layer used in the fixed layer 104 and the free layer 106 and the MgO barrier layer are oxidized or reduced by radicals or ions produced in the plasma, and thereby the characteristics of the magnetic tunnel junction is deteriorated. In particular, in the case of a magnetic tunnel junction that realizes perpendicular magnetization using interface magnetic anisotropy at a stack interface between the MgO barrier layer 105 and the fixed layer 104 or the free layer 106, deterioration of magnetic and electrical characteristics due to oxidation or reduction is significant.

Patent Literature 1 discloses a method of plasmatizing $CH_3OH$ gas as a method of plasma etching using an oxidizing gas. However, due to using the oxidizing gas, the fixed layer 104 or the free layer 106 is oxidized, and a magnetic oxide layer 110 that deteriorate the magnetic and electrical characteristics of the magnetic tunnel junction is formed on side walls of the magnetic tunnel junction (see FIG. 1).

On the other hand, in a protective film forming step, since a protective film having good coverage can be formed under reduced pressure, a chemical vapor deposition (CVD) method using plasma is used. However, since the plasma CVD method generally uses a precursor gas with which a reducing gas is mixed, a damaged layer is formed due to a reduction reaction. As a result, the characteristics of the magnetic tunnel junction are deteriorated. In order to avoid the characteristic deterioration, Patent Literature 2 discloses a method of forming a protective film having a two-layer structure. In this method, a film is formed by a sputtering method, or the sputtering method and the plasma CVD method are combined. However, the sputtering method has a problem in that it is difficult to form a dense film compared to the plasma CVD method, and a combination of the sputtering method and the plasma CVD method lowers the throughput.

Therefore, in the manufacturing of the magnetic tunnel junction, it is necessary to remove the magnetic oxide layer 110 formed by plasma etching and to suppress plasma damage during the formation of the protective caused by the plasma CVD method.

Patent Literature 3 discloses a method of removing the magnetic oxide layer 110 formed by plasma etching. After the magnetic layer is etched by the plasma using an oxidizing gas, a reduction treatment is performed in a radical treatment chamber using the plasma produced by the reducing gas. As a result, the magnetic oxide layer 110 formed during the etching of the magnetic layer is removed.

Patent Literature 4 discloses a method of recovering the magnetic oxide layer 110 using an organic acid gas. For example, the magnetic oxide layer 110 is subjected to a reduction treatment using a formic acid gas or the like. The types of the organic acid gas, such as the formic acid gas, are limited to those reducing the magnetic oxide layer 110 and not reducing the MgO barrier layer 105. With this method, the MgO barrier layer 105 exhibits good characteristics and the magnetic oxide layer 110 can be recovered.

Further, Non-Patent Literature 1 and Non-Patent Literature 2 disclose a method of using an organic acid gas to remove a damaged layer caused by plasma etching. In this method, the magnetic oxide layer 110 is formed using plasma of an oxidizing gas after the plasma etching, and then a volatile metal complex is generated by a reaction between the organic acid gas and the magnetic oxide layer 110, thereby removing the damaged layer.

PRIOR ART LITERATURE

Patent Literature

Patent Literature 1: JP-A-2005-042143
Patent Literature 2: JP-A-2010-103303
Patent Literature 3: JP-A-2009-302550
Patent Literature 4: JP-A-2017-123355
Patent Literature 5: JP-A-2013-140891

Non-Patent Literature

Non-Patent Literature 1: J. K.-C. Chen, N. D. Altieri, T. Kim, E. Chen, T. Lill, M. Shen and J. P. Chang, "Directional etch of magnetic and noble metals. II. Organic chemical vapor etch", Journal of Vacuum Science & Technology A: Vacuum, Surfaces, and Films 35, 05C305 (2017)
Non-Patent Literature 2: J. K.-C. Chen, N. D. Altieri, T. Kim, E. Chen, T. Lill, M. Shen and J. P. Chang, "Ion beam assisted organic chemical vapor etch of magnetic thin films", Journal of Vacuum Science & Technology A: Vacuum, Surfaces, and Films 35, 031304 (2017)

SUMMARY OF INVENTION

Technical Problem

In the method of recovering the magnetic oxide layer 110 by the reducing gas as disclosed in Patent Literature 3, when the irradiation amount of hydrogen plasma emitted in the recovery process is too large, the MgO barrier layer 105 is also reduced in addition to the magnetic oxide layer, so that the electrical characteristics of the magnetic tunnel junction are deteriorated. Therefore, it is necessary to control the irradiation amount of the plasma containing hydrogen to an appropriate value. The optimum irradiation amount of the plasma in the recovery method of the magnetic oxide layer 110 using the plasma containing hydrogen depends strongly on etching conditions of the magnetic tunnel junction before the recovery method is performed. Therefore, since process conditions for suppressing the reduction of the MgO barrier layer 105 and reducing the magnetic oxide layer 110 need to be set in accordance with the etching conditions in the previous steps, it is difficult to apply in the mass production process.

On the other hand, the method of suppressing the reduction of the MgO barrier layer 105 and reducing the magnetic oxide layer 110 as disclosed in Patent Literature 4 can reduce the magnetic oxide layer 110 by a reaction between the magnetic oxide layer 110 and a reducing gas such as a formic acid. Further, since a condition under which the reaction between the MgO barrier layer 105 and formic acid does not proceed can be realized, the reduction of the MgO barrier layer 105 can be suppressed and the reduction of the magnetic oxide layer 110 can be promoted.

However, in the reaction disclosed in Patent Literature 4, $H_2O$ is produced as a reaction product. Since the MgO barrier layer 105 has deliquescent property, the MgO barrier layer 105 is deliquesced by $H_2O$, which may cause short-circuit failure or magnetic property deterioration. Therefore, it is required to promote the reduction of the magnetic oxide layer 110 and suppress the deliquescence of the MgO barrier layer 105 caused by $H_2O$ while suppressing the reduction of the MgO barrier layer 105 of the magnetic tunnel junction.

Solution to Problem

An aspect of the invention provides a method of manufacturing a magnetic tunnel junction, including: a first step of etching a stacked film including a first magnetic layer, a MgO barrier layer, and a second magnetic layer stacked in order by plasma etching using an oxidizing gas to form the magnetic tunnel junction; and a second step of simultaneously introducing an organic acid gas which is an n-valent acid and a precursor gas having a corresponding metal element valence of m, to form a first protective film on side walls of the magnetic tunnel junction, in which in the second step, the precursor gas is introduced at a molar ratio of n/m or more with respect to 1 mole of the organic acid gas introduced.

Another aspect of the invention provides a method of manufacturing a magnetic tunnel junction, including: etching a first partial stacked film of a stacked film including a first magnetic layer, a barrier layer, and a second magnetic layer stacked in order, that is a part of the stacked film to the second magnetic layer, using a hard mask on the stacked film; simultaneously introducing an organic acid gas which is an n-valent acid and a precursor gas having a corresponding metal element valence of m, to remove a surface oxide layer formed on an upper surface and side walls of the hard mask and side walls of the first partial stacked film and form, on the upper surface and the side walls of the hard mask and the side walls of the first partial stacked film, a hard coating having an etching resistance more excellent than that of the hard mask; and etching a second partial stacked film of the stacked film on and below the barrier layer.

Advantageous Effect

A magnetic oxide layer formed on side walls of a magnetic tunnel junction can be removed and deterioration of characteristics of the magnetic tunnel junction can be suppressed. Further, corner rounding of a hard mask can be suppressed.

Other problems and novel features will become apparent from the description and the attached drawings.

BRIEF DESCRIPTION OF DRAWINGS

FIG. 1 shows a cross section of a magnetic tunnel junction.
FIG. 2 shows an overall flow of a first embodiment and a second embodiment.
FIG. 3A is a cross-sectional view of the magnetic tunnel junction in a process flow of the first embodiment.
FIG. 3B is a cross-sectional view of the magnetic tunnel junction in the process flow of the first embodiment.
FIG. 3C is a cross-sectional view of the magnetic tunnel junction in the process flow of the first embodiment.
FIG. 3D is a cross-sectional view of the magnetic tunnel junction in the process flow of the first embodiment.
FIG. 3E is a cross-sectional view of the magnetic tunnel junction in the process flow of the first embodiment.
FIG. 3F is a cross-sectional view of the magnetic tunnel junction in the process flow of the first embodiment.
FIG. 4 shows examples of an organic acid that can be used to reduce a magnetic oxide layer.
FIG. 5 shows volatilization temperatures of volatile metal complexes of Fe and Co.

FIG. 6 shows examples of a precursor gas.

FIG. 7 shows desired molar ratios of the precursor gas to an organic acid gas.

FIG. 8 is a flowchart of a method of manufacturing the magnetic tunnel junction of the first embodiment.

FIG. 9 is a flowchart of a method of manufacturing a magnetic tunnel junction of the second embodiment.

FIG. 10 is a flowchart of a method of manufacturing a magnetic tunnel junction (modification).

FIG. 11 is a flowchart of a method of manufacturing a magnetic tunnel junction (modification).

FIG. 12 is a flowchart of a method of manufacturing a magnetic tunnel junction of a third embodiment.

FIG. 13A is a cross-sectional view of the magnetic tunnel junction in a process flow of the third embodiment.

FIG. 13B is a cross-sectional view of the magnetic tunnel junction in the process flow of the third embodiment.

FIG. 13C is a cross-sectional view of the magnetic tunnel junction in the process flow of the third embodiment.

FIG. 13D is a cross-sectional view of the magnetic tunnel junction in the process flow of the third embodiment.

FIG. 13E is a cross-sectional view of the magnetic tunnel junction in the process flow of the third embodiment.

FIG. 14 is a flowchart of a method of manufacturing the magnetic tunnel junction of the third embodiment.

FIG. 15A is a cross-sectional view of the magnetic tunnel junction in the process flow of the third embodiment.

FIG. 15B is a cross-sectional view of the magnetic tunnel junction in the process flow of the third embodiment.

FIG. 15C is a cross-sectional view of the magnetic tunnel junction in the process flow of the third embodiment.

FIG. 16 is a flowchart of a method of manufacturing a magnetic tunnel junction of a fourth embodiment.

FIG. 17 is a flowchart of a method of manufacturing a magnetic tunnel junction (modification).

DESCRIPTION OF EMBODIMENTS

FIG. 2 shows an overall flow of a first embodiment and a second embodiment. First, a magnetic oxide layer 110 is formed on side walls of a magnetic tunnel junction by plasma etching using an oxidizing gas or plasma of an oxidizing gas after plasma etching (step 201). When a free layer 106 and a fixed layer 104 are magnetic layers containing elements such as Fe and Co, the magnetic oxide layer 110 of $Fe_2O_3$, $Fe_3O_4$, $CO_3O_4$, or the like is formed on the side walls. Since the magnetic oxide layer 110 has a magnetic property different from that of the magnetic layers such as the free layer 106 and the fixed layer 104, the performance of the magnetic tunnel junction may be influenced. In addition, the magnetic oxide layer 110 may have conductivity, which is a reason for a short circuit failure of the magnetic tunnel junction. The magnetic oxide layer 110 has a thickness of about several nanometers with respect to several tens of nanometers in diameter of the magnetic tunnel junction.

Subsequently, an organic acid gas and a precursor gas are introduced into a chamber for etching the magnetic tunnel junction (step 202). As a first reaction, the organic acid gas (such as a formic acid) reacts with oxides such as $Fe_2O_3$, $Fe_3O_4$, and $CO_3O_4$ to form a volatile metal complex of Fe or Co. When the metal complex of Fe or Co is volatilized, the magnetic oxide layer 110 formed on the side walls of the magnetic tunnel junction is removed. This first reaction produces $H_2O$ at the same time. In step 202, a second reaction is generated in which the precursor gas ($Al(acac)_3$) reacts with $H_2O$ produced in the first reaction. As a result, a first protective film (such as $Al_2O_3$) is formed on the side walls of the magnetic tunnel junction. The thickness of the first protective film is about several nanometers that is substantially equal to the thickness of the magnetic oxide layer 110. As a method of introducing the organic acid gas and the precursor gas in step 202, there are a method of simultaneously introducing the organic acid gas and the precursor gas and a method of alternately introducing the organic acid gas and the precursor gas.

Finally, a second protective film covering the magnetic tunnel junction is formed. Since this protective film is required to have excellent barrier property, it is desirable to form the protective film using an insulating material such as SiN, $SiO_2$, $Al_2O_3$, $Ta_2O_5$, or $TiO_2$. A sputtering method, a plasma CVD method, or the like can be applied to form the second protective film, and a method capable of forming the protective film with good coverage under reduced pressure is desirable.

First Embodiment

FIGS. 3A to 3F are cross-sectional views of a magnetic tunnel junction in a process flow of the first embodiment. In this embodiment, magnetic oxide layers 310, which are the oxidation damage on side walls, are removed, and an insulating oxide is formed as a protective film.

A stacked film for forming the magnetic tunnel junction is formed on a lower electrode film 302 on a Si substrate 301. As a stacked film, an underlayer 303 for controlling the crystallinity of a magnetic material and stabilizing the magnetization of a fixed layer, a fixed layer 304 made of a magnetic material containing elements such as Co or Fe, a MgO barrier layer 305, a free layer 306 made of a magnetic material containing elements such as Co or Fe, a capping layer 307 for protecting the free layer, and a hard mask 308 are stacked in order. A resist mask 309 having a prescribed pattern is formed on the hard mask 308 for element isolation. FIG. 3A shows this step.

Since the magnetic tunnel junction is formed in a wiring layer of a semiconductor device, although not shown in FIG. 3A, a transistor for selecting each magnetic tunnel junction or a wiring for coupling each element is formed between the Si substrate 301 and the lower electrode film 302 forming the wiring layer. Here, used as a mask for etching the magnetic tunnel junction, the hard mask 308 is desired to be made of a metal material such as Ta, W, TaN, Ti, TiN, or Ru.

The stacked structure of the magnetic tunnel junction of the present embodiment is not limited to FIG. 3A, and may have at least the fixed layer 304 made of a magnetic material, the MgO barrier layer 305, and the free layer 306 made of a magnetic material, and the stacked structure thereof is not limited. For example, two or more stacked structures of the fixed layer 304, the MgO barrier layer 305, and the free layer 306 may be stacked in order to realize a multi-value magnetic tunnel junction. Further, the invention is not limited to a bottom pin structure as shown in FIG. 3A, and may be a top pin structure in which the free layer 306 is formed on a lower layer of the MgO barrier layer 305 and the fixed layer 304 is formed on an upper layer of the MgO barrier layer 305.

FIG. 3B shows a step of etching the hard mask 308 using the resist mask 309. The etching can be either ion beam etching or plasma etching. After the hard mask 308 is etched, the remaining resist mask 309 is removed.

FIG. 3C shows a step of etching the remaining stacked films (303 to 307) using the hard mask 308. For etching the stacked films (303 to 307), plasma etching using an oxidizing gas, which is suitable for fine etching, is desirable. Since the oxidizing gas is used in the plasma etching, oxidation proceeds on side walls of the free layer 306 and the fixed layer 304 composed of magnetic layers containing elements such as Co and Fe, and the magnetic oxide layers 310 are formed on the side walls. As described with reference to FIG. 1, the magnetic oxide layer 310 is an oxide of magnetic substances such as $Fe_2O_3$, $Fe_3O_4$, or $Co_3O_4$, and has a thickness of about several nanometers.

FIG. 3D shows a step of removing the magnetic oxide layers 310 to form first protective films 311 on the side walls of the free layer 306 and the fixed layer 304. In order to implement this step, in the first embodiment, an organic acid gas and a precursor gas are simultaneously introduced into a chamber for etching the magnetic tunnel junction. There are two reactions in this step.

A reaction between the organic acid gas and the magnetic oxide layer 310, which is a first reaction, will be described. In this step, the magnetic element of the magnetic oxide layer 310 produces a metal complex and $H_2O$ due to the reaction between the organic acid gas and the magnetic oxide layer 310. The metal complex is volatile, and the magnetic oxide layer 310 is removed by the volatilization of the metal complex. At this time, since the reaction of the organic acid gas with the MgO barrier layer 305 influences the characteristics of the magnetic tunnel junction, it is necessary to prevent the organic acid gas from reacting with the MgO barrier layer 305 while reacting the organic acid with the magnetic element of the magnetic oxide layer 310.

A case where the magnetic oxide layer 310 is $Fe_2O_3$ and the organic acid gas is a formic acid (HCOOH) will be described as an example. In the first reaction, in order to remove the magnetic oxide layer 310, it is necessary to spontaneously proceed the reduction reaction between $Fe_2O_3$ and the formic acid.

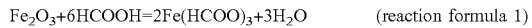

$Fe_2O_3 + 6HCOOH = 2Fe(HCOO)_3 + 3H_2O$ (reaction formula 1)

(Reaction formula 1) is a reduction reaction of $Fe_2O_3$ and the formic acid, and a metal complex and $H_2O$ are produced. At this time, since the organic acid gas can also have a reduction reaction with the MgO barrier layer 305, it is necessary to select an organic acid gas which does not allow the reduction of the MgO barrier layer 305 to spontaneously proceed.

The organic acid gases satisfying this condition are shown in FIG. 4. It is desirable to use gases containing a carboxyl group (formic acid (HCOOH) gas, acetic acid ($CH_3COOH$) gas, propionic acid ($CH_3CH_2COOH$) gas, and the like), or gases containing an aldehyde group (formaldehyde (HCHO) gas, acetaldehyde ($CH_3CHO$) gas, propionaldehyde ($C_2H_5CHO$) gas and the like, or acetylacetone ($C_5H_8O_2$) gas and the like.

The magnetic oxide layer 310 may be $Fe_3O_4$, $Co_3O_4$, or the like. In these cases, from the viewpoint of removal by volatilization, the metal complex as the reaction product is preferably a volatile metal complex having a low volatilization temperature such as $Fe(CO)_5$, $Fe(acac)_3$, or Co $(acac)_3$, but a volatile metal complex containing a carboxyl group or an aldehyde group may be used. The volatilization temperature of the metal complex is preferably 300° C. or lower. FIG. 5 shows the volatile temperatures (boiling points) of volatile organics of Fe and Co.

In the step shown in FIG. 3D, a second reaction is generated between $H_2O$ and the precursor gas. $H_2O$ is the reaction product in the first reaction described above. The first protective films 311 are formed on the side wall portions of the magnetic tunnel junction from which the magnetic oxide layers 310 are removed by the second reaction between $H_2O$ and the precursor gas. When the precursor gas is aluminum acetylacetone $Al(acac)_3$,

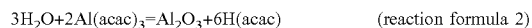

$3H_2O + 2Al(acac)_3 = Al_2O_3 + 6H(acac)$ (reaction formula 2)

$Al_2O_3$ is spontaneously produced according to (reaction formula 2). As the first protective film 311, in addition to $Al_2O_3$, oxides such as $TiO_2$, $SiO_2$ or $Ta_2O_5$ which have high insulation properties and do not exhibit magnetism can also be used. The precursor gases satisfying these conditions are shown in FIG. 6. It is desirable to use an acetylacetone metal complex ($Al(acac)_3$ gas, $Ti(acac)_4$ gas, and the like) or a metal complex containing a hydroxyl group ($Al(CH_3O)_3$ gas, $Ti(C_3H_7O)_4$ gas, and the like).

When the organic acid gas and the precursor gas are simultaneously introduced and $H_2O$ produced in the first reaction still remains after the second reaction, the deliquescent MgO barrier layer 305 may be influenced, and the characteristics of the magnetic tunnel junction may be deteriorated. Therefore, the molar ratio of the organic acid gas to the precursor gas introduced in the step shown in FIG. 3D is adjusted such that $H_2O$ does not remain after the second reaction.

Regarding the adjustment of the molar ratio, FIG. 7 shows the ratio of precursor/organic acid according to the valence of a metal element corresponding to the precursor gas, taking a case where the organic acid gas is a monovalent acid as an example. For example, when the formic acid HCOOH which is a monovalent acid is used as the organic acid gas and aluminum acetylacetone $Al(acac)_3$ is used as the precursor gas, it can be known from the above (reaction formula 1) and (reaction formula 2) that $H_2O$ produced in (reaction formula 1) is completely consumed in (reaction formula 2) if the molar ratio is 2 moles of aluminum acetylacetone to 6 moles of formic acid. That is, if the molar ratio of aluminum acetylacetone is ⅓ or more with respect to 1 mole of the formic acid, $H_2O$ produced in the first reaction can be removed by the second reaction. In general, when the organic acid gas is an n-valent acid and the valence of the metal element corresponding to the precursor gas is m, the precursor gas may have a molar ratio of n/m or more with respect to 1 mole of the organic acid gas.

FIG. 3E shows a step of forming a second protective film 312 covering the magnetic tunnel junction. The second protective film 312 is formed by a plasma CVD method. Since the side walls of the free layer 306 and the fixed layer 304 are already covered with the first protective films 311, it is possible to prevent deterioration of characteristics of the magnetic tunnel junction due to gases such as hydrogen, nitrogen, or oxygen or plasma produced during plasma CVD film formation. It is desirable to form, as the second protective film 312, a protective film of an insulation material such as SiN, $SiO_2$, $Al_2O_3$, $Ta_2O$, or $TiO_2$ because of excellent barrier properties thereof. The method of forming the second protective film 312 may be a sputtering method or a CVD method. The formation of the first protective film 311 in the step shown in FIG. 3D and the formation of the second protective film 312 shown in FIG. 3E may be performed by the same device or different devices.

Thereafter, an insulating interlayer 313 is formed between the magnetic tunnel junctions, the second protective film 312 covering the upper part of the magnetic tunnel junction is removed, and an upper electrode film 314 is formed so as to be electrically connected to the hard mask 308. FIG. 3F shows the magnetic tunnel junction subjected to these steps.

The above-described method of manufacturing the magnetic tunnel junction is summarized in FIG. 8 as a flowchart.

First, the hard mask layer is etched (step 801), and the stacked film is etched using the oxidizing gas (step 802). At this time, the magnetic oxide layers 310 are formed on the side walls of the magnetic tunnel junction. Thus, by simultaneously introducing the organic acid gas and the precursor gas, the magnetic oxide layers 310 on the side walls are removed and the first protective films 311 are formed (step 803). Thereafter, in step 804 shown in FIG. 8, the second protective film 312 covering the magnetic tunnel junction is formed.

By applying the method of manufacturing a magnetic tunnel junction according to the first embodiment, the magnetic oxide layers 310 on the side walls can be removed and the first protective films 311 can be formed. Accordingly, it is possible to simultaneously realize the removal of etching damages to the magnetic tunnel junction and damage reduction due to the formation of the protective film. In addition, since $H_2O$ produced in the first reaction is removed in the second reaction, the risk of deliquescence of the MgO barrier layer can be avoided.

Second Embodiment

In a second embodiment, a case where plasma etching without using an oxidizing gas is applied or ion beam etching is applied when a stacked film is processed will be described. When these processes are applied, the magnetic oxide layers 310 are not formed in a step (corresponding to step 802 in FIG. 8) of etching the stacked film. However, since a dense film can be formed in a subsequent step of forming a protective film (the second protective film 312), it is desirable to form a film by a plasma CVD method. When the second protective film 312 is formed directly on the magnetic tunnel junction by the plasma CVD method, the magnetic oxide layers 310 are formed on the side walls of the free layer 306 and the fixed layer 304, and the element characteristics are deteriorated. Therefore, in the second embodiment, even when the stacked film is processed by the plasma etching without using the oxidizing gas or by the ion beam etching, damage to the side walls of the magnetic tunnel junction in forming the protective film by the plasma CVD method is reduced by introducing a post-etching oxidation step.

FIG. 9 shows a process flow of a method of manufacturing the magnetic tunnel junction according to the second embodiment. Step 901 is a step of etching the hard mask layer and is the same as step 801 shown in FIG. 8. Step 902 is a step of etching the magnetic tunnel junction by the plasma etching without using the oxidizing gas or by the ion beam etching. Since no oxidizing gas is used, in step 902, the magnetic oxide layers 310 are not formed on the side walls of the magnetic tunnel junction. In the plasma etching without using the oxidizing gas, a reactive gas such as hydrogen or nitrogen is used, and in the ion beam etching, a rare gas such as He, Ne, Ar, Kr, or Xe or a mixed gas thereof is used. In the case of the plasma etching, reductive damage such as the reduction of MgO may be caused on the side walls of the magnetic tunnel junction due to the etching conditions. In the case of the ion beam etching, the reactive gas is not used, and therefore neither oxidation damage nor the reductive damage occurs.

Subsequently, an oxidation step is introduced after the etching (step 903). By introducing this step, the magnetic oxide layers 310 can be formed on the side walls of the magnetic tunnel junction in the same manner as in the first embodiment. In the oxidation step of step 903, the side walls of the magnetic tunnel junction can be oxidized by means of irradiating the magnetic tunnel junction with the plasma using the oxidizing gas or irradiating the magnetic tunnel junction only with oxygen radicals produced in the plasma using the oxidizing gas. In the case where the reductive damage is generated in the MgO barrier layer due to the plasma etching, the reductive damage can be recovered in the oxidation step in step 903.

Since the magnetic oxide layers 310 are formed by introducing the oxidation step in step 903, the first protective films 311 can be formed by removing the magnetic oxide layers 310 on the side walls by simultaneously introducing an organic acid gas and a precursor gas in the same manner as in step 803 in FIG. 8. Step 905 is a step of forming the second protective film 312 of the magnetic tunnel junction, which is the same as step 804 in FIG. 8, but is formed by a plasma CVD method.

As described above, in the second embodiment, when the plasma etching without using the oxidizing gas or the ion beam etching is used, the damage to the side walls of the magnetic tunnel junction and the deterioration of element characteristics in the step of forming the second protective film 312 by the plasma CVD method can be reduced by introducing the post-etching oxidation step.

Hereinafter, a modification applicable to the process flows of the first embodiment and the second embodiment will be described. In step 803 in FIG. 8 and step 904 in FIG. 9, the organic acid gas and the precursor gas are simultaneously introduced. When the organic acid gas and the precursor gas are simultaneously introduced, the organic acid gas may react with the precursor gas due to the combination thereof, and the magnetic oxide layers 310 on the side walls of the magnetic tunnel junction may not be removed. Therefore, the combination of the organic acid gas and the precursor gas that can be introduced simultaneously is limited. In the present modification, by alternately introducing the organic acid gas and the precursor gas, the direct reaction between the organic acid gas and the precursor gas is prevented. The number of times of alternately introducing the organic acid gas and precursor gas is one or more.

FIG. 10 shows a modification of the process flow of the method of manufacturing the magnetic tunnel junction. Step 1001 corresponds to step 802 in FIG. 8 and step 903 in FIG. 9. Step 1002 shows a step of alternately repeating a step 1 of introducing an organic acid gas and a step 2 of introducing a precursor gas. The number of times of alternately introducing the organic acid gas and precursor gas is one or more. Accordingly, the magnetic oxide layers 310 on the side walls of the magnetic tunnel junction are removed, and the first protective films 311 made of $Al_2O_3$ and the like are formed on the side walls of the magnetic tunnel junction. In order to prevent the first protective films 311 from being formed on the side walls before removing the magnetic oxide layers 310, in step 1002, it is desirable to start with step 1 of introducing the organic acid gas.

The organic acid gases described in FIG. 4 can be applied as the organic acid gas used in step 1 of introducing the organic acid gas. On the other hand, the condition of the precursor gas used in step 2 of introducing the precursor gas is not simultaneously introducing the organic acid gas and the precursor gas, so the limitation of the combination of the organic acid gas and the precursor gas is relaxed. The precursor gas may be any precursor gas that reacts with $H_2O$ to form an insulation film, in addition to the precursor gases shown in FIG. 6. Step 1003 corresponds to step 804 in FIG. 8 and step 905 in FIG. 9.

In the present modification, the organic acid gas and the precursor gas are alternately introduced to prevent direct reaction between the organic acid gas and the precursor gas. As a result, the usable combination of the organic acid gas and the precursor gas can be increased.

FIG. 11 shows another modification of the process flow of the method of manufacturing the magnetic tunnel junction. Although FIG. 11 shows a heat treatment for improving the insulation property of the first protective film 311 in the flow of the first embodiment, the heat treatment can also be applied to the second embodiment and the modifications.

Steps 1101, 1102, and 1103 in FIG. 11 are the same as steps 801, 802, and 803 in FIG. 8. Step 1104 is a heat treatment step. By performing a heat treatment in a temperature range of 150° C. to 300° C. in a vacuum, impurities such as C that may be contained in the first protective films 311 can be reduced, and barrier properties and insulation properties of the first protective film 311 can be improved. A heat treatment method applied in step 1104 may be direct heating of a substrate by a heater. Heating by infrared light or laser light irradiation, or overheating by plasma is also feasible. Step 1105 is a step of forming the second protective film 312, which is the same as step 804 in FIG. 8.

In the present modification, by introducing the heat treatment after the first protective films 311 are formed, the barrier property and the insulation property of the first protective films 311 can be improved, and the etching damage to the magnetic tunnel junction caused by a subsequent step such as a film forming step of the second protective film 312 can be reduced.

Third Embodiment

In order to form a magnetic tunnel junction, it is known that in a step (for example, the step shown in FIG. 3C) of etching a stacked film by dry etching, the emitted ions are likely to concentrate on an upper corner portion of the hard mask 308. Therefore, the etching rate of the peripheral portion of the upper surface of the hard mask 308 tends to be higher than the etching rate at the central portion of the upper surface. As a result, a cross-sectional shape of the hard mask 308 during the etching is subjected to corner rounding of the hard mask which means the upper corner portion thereof cannot maintain the rectangularity and is rounded and retreats.

As the miniaturization of the magnetic tunnel junction proceeds, when the diameter of the magnetic tunnel junction becomes smaller, the influence of the corner rounding of the hard mask becomes significant. For example, the diameter of the magnetic tunnel junction is small, the hard mask is subjected to the corner rounding during the etching of the stacked film, the flat portion of the upper surface of the hard mask 308 eventually disappears, and the entire upper surface is curved (for example, spherical shape). In this case, the angle between an ion incident direction and the upper surface of the hard mask 308 is not 90° at any portion of the upper surface. Since the etching rate depends on the ion incident angle, the etching rate tends to increase with the progress of the corner rounding, and when the flat portion of the upper surface of the hard mask is lost, the film thickness of the hard mask is rapidly decreased thereafter.

On the other hand, in order to electrically connect the magnetic tunnel junction and the upper electrode film 314 as shown in FIG. 3, the hard mask 308 is exposed by subjecting the protective film 312 and the insulating interlayer 313 to a planarization process such as chemical mechanical polishing (CMP). That is, the hard mask 308 is used as a plug for connecting to the upper electrode film 314. At this time, when the film thickness of the hard mask 308 is significantly reduced, the process margin of the process of exposing the hard mask 308 may be reduced, and an open defect may occur between the magnetic tunnel junction and the upper electrode film without sufficiently exposing the hard mask, and even the magnetic layer of the magnetic tunnel junction may be removed in addition to the hard mask.

Patent Literature 5 discloses a method of suppressing the corner rounding of a hard mask by ion beam etching by forming a hard coating on side walls of a magnetic tunnel junction. According to this, after patterning the hard mask, the hard coatings are formed on an upper surface and side walls of the hard mask and an upper surface of a reference layer of the exposed magnetic tunnel junction by a CVD method or an atomic layer deposition (ALD) method. Thereafter, the hard coatings on the upper surface of the hard mask and the upper surface of the reference layer are removed by etching, and then ion beam etching of the stacked film of the magnetic tunnel junction is performed using the hard mask and a hard layer as masks. When the side walls of the hard mask are covered with the hard coatings, it is possible to suppress the corner rounding of the hard mask when the stacked structure of the magnetic tunnel junction is etched.

However, since the hard coating on the upper surface of the hard mask is also removed by etching back the hard coating on the upper surface of the reference layer, in the etching step of the stacked film of the magnetic tunnel junction, the corner rounding of the hard mask starts to proceed when the hard coatings protecting the side walls of the hard mask are etched away from the top portion and the side walls of the hard mask are exposed. Thus, in Patent Literature 5, the effect of suppressing the corner rounding of the hard mask is limited.

In a third embodiment, an organic acid gas and a precursor gas are introduced into a chamber for etching a magnetic tunnel junction to selectively form a hard coating on a stacked film above the MgO barrier layer, thereby suppressing the corner rounding of the hard mask. FIG. 12 shows a process flow of a method of manufacturing the magnetic tunnel junction according to the third embodiment. As the magnetic tunnel junction according to the third embodiment, a magnetic tunnel junction formed by etching a stacked film same as that in the first embodiment is exemplified (FIGS. 13A to 13E). In the following description, the same contents as those of the first embodiment will not be described.

Step 1201 is a step of patterning the hard mask 308 with the resist mask 309. The magnetic tunnel junction at this time is the same as that shown in FIG. 3B in the first embodiment. The material of the hard mask 308 is a metal material such as Ta or W in order to form a hard coating to be described later. Ru or the like can be used as the capping layer 307.

Step 1202 is a step of etching the stacked film until the free layer 306 using the hard mask 308 to expose the MgO barrier layer 305. In this step, an end point of the etching is controlled based on an etching time. In the step of etching the free layer 306, plasma etching using an oxidizing gas is used. Since the oxidizing gas is used in the plasma etching, as shown in FIG. 13A, the side walls and the upper surface of the hard mask 308 and the side walls of the capping layer 307 and the free layer 306 are oxidized to form a surface oxide layer 1301.

The surface oxide layer 1301 depends on the material of the stacked film, and is composed of: a nonmagnetic oxide layer 1302 made of, for example, $Ta_2O_5$ on the upper surface and side walls of the hard mask 308; a nonmagnetic oxide layer 1303 made of, for example, $RuO_2$ on the side walls of the capping layer 307; and a magnetic oxide layer 1304 made of, for example, $Fe_2O_3$, $Fe_3O_4$, and $Co_3O_4$ on the side walls of the free layer 306. The thickness of the surface oxide layer 1301 is about several nanometers. In Step 1202, since the thickness of the stacked film (306, 307) to be etched is about several nanometers, the hard mask 308 processed by the etching of this step is less likely to be subjected to corner rounding.

Step 1203 is a step of simultaneously introducing the organic acid gas and the precursor gas into the chamber for etching the magnetic tunnel junction. The chamber for performing the process of step 1203 is preferably the same chamber as in the process of step 1202, but another chamber may also be used.

The reaction generated in step 1203 will be described. In step 1203, the surface oxide layer 1301 is removed, and a chemical reaction for forming a hard coating 1305 shown in FIG. 13B is generated. Specifically, on the surface oxide layer 1301, two reactions proceed. The two reactions are a first reaction with the organic acid gas and a second reaction with the precursor gas.

A metal organic and $H_2O$ are produced by the reaction, which is the first reaction, between the organic acid gas and the surface oxide layer 1301. The metal organic is volatile, and the surface oxide layer 1301 is removed by the volatilization of the metal organic. At this time, the reaction between the organic acid gas and the surface oxide layer 1301 proceeds, while the reaction of the organic acid gas with the MgO barrier layer 305 needs to be prevented. Non-Patent Literature 1 discloses a method of removing an oxide by generating a volatile metal complex by a reaction between an organic acid gas such as a formic acid gas and an oxide of a metal material containing elements such as Co or Fe. Further, Patent Literature 4 discloses that the reduction of MgO or the modification of MgO to $Mg(OH)_2$ are prevented and MgO does not react with a formic acid when the pressure in a chamber is set within a range of 0.1 Pa to 22000 Pa and the treatment temperature is set within a range of 107° C. to 400° C.

Therefore, under conditions that the organic acid to be applied is formic acid (HCOOH) and the reaction between the formic acid and the MgO barrier layer 305 is prevented (for example, the chamber pressure is 100 Pa, the treatment temperature is 200° C.), when the organic acid is reacted with the surface oxide layer 1301, the following reduction reactions proceed as the first reaction in the magnetic tunnel junction shown in FIG. 13A.

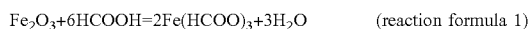
$Fe_2O_3 + 6HCOOH = 2Fe(HCOO)_3 + 3H_2O$ (reaction formula 1)

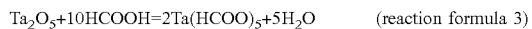
$Ta_2O_5 + 10HCOOH = 2Ta(HCOO)_5 + 5H_2O$ (reaction formula 3)

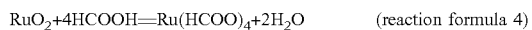
$RuO_2 + 4HCOOH = Ru(HCOO)_4 + 2H_2O$ (reaction formula 4)

(Reaction formula 1), (reaction formula 3) and (reaction formula 4) are reactions between the surface oxide layer 1301 and the organic acid gas (formic acid) and produce metal complexes and $H_2O$. The reactions of (reaction formula 1), (reaction formula 3) and (reaction formula 4) proceed spontaneously, while the reaction between the MgO barrier layer 305 and the organic acid gas does not proceed spontaneously.

As a result, the first reaction proceeds on the surface oxide layer 1301, and the volatile metal complexes and $H_2O$ are produced. On the other hand, since the first reaction does not proceed on the MgO barrier layer 305, $H_2O$ is not produced. The metal complexes which are reaction products are preferably ones having a low volatilization temperature from the viewpoint of removal by volatilization, but a volatile metal complex containing a carboxyl group or an aldehyde group may also be used. The volatilization temperature of the metal complex is preferably equal to or lower than the temperature in the chamber.

After the first reaction, the second reaction is generated between $H_2O$ and the precursor gas. $H_2O$ is the reaction product in the first reaction described above. By the second reaction between $H_2O$ and the precursor gas, the hard coating 1305 having high etching resistance is formed on the upper surface and side walls of the hard mask 308 from which the surface oxide layer 1301 shown in FIG. 13B is removed and on the side walls of the capping layer 307 and the free layer 306. When the precursor gas is aluminum acetylacetone $Al(acac)_3$,

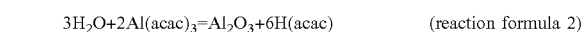
$3H_2O + 2Al(acac)_3 = Al_2O_3 + 6H(acac)$ (reaction formula 2)

similar to the first embodiment, $Al_2O_3$ is spontaneously produced according to (reaction formula 2). As the hard coating 1305, it is desirable to use a material such as $Al_2O_3$ which is more excellent in etching resistance than Ta, has high insulation properties and does not exhibit magnetism.

When the organic acid gas and the precursor gas are simultaneously introduced and $H_2O$ produced in the first reaction remains after the second reaction, the deliquescent MgO barrier layer 305 may be influenced, causing problems such as short-circuit failure and magnetic property deterioration. Therefore, the molar ratio of the introduced organic acid gas to the precursor gas is adjusted such that $H_2O$ does not remain after the second reaction.

For example, when the formic acid HCOOH which is a monovalent acid is used as the organic acid gas and aluminum acetylacetone $Al(acac)_3$ is used as the precursor gas, the molar ratio of produced $H_2O$ is 3 with respect to the molar ratio 6 of the formic acid according to (reaction formula 1), (reaction formula 3), and (reaction formula 4). At this time, if the molar ratio of aluminum acetylacetone $Al(acac)_3$ is 2, all the $H_2O$ are consumed in (reaction formula 2). That is, if the molar ratio of aluminum acetylacetone Al(acac) is ⅓ or more with respect to the molar ratio 1 of the formic acid, $H_2O$ produced by the first reaction can be removed by the second reaction. In general, when the organic acid gas is an n-valent acid and the valence of the metal element corresponding to the precursor gas is m, the precursor gas may have a molar ratio of n/m or more with respect to 1 mole of the organic acid gas.

In step 1203, as in the first embodiment, it is possible to use the organic acids as exemplified in FIG. 4. However, a reaction (first reaction) for producing a corresponding volatile metal complex from the surface oxide layer 1301 spontaneously proceeds with respect to each gas, and it is necessary to set a temperature and a pressure that satisfy a condition under which the reduction reaction or modification of the MgO barrier layer 305 does not proceed.

Further, among the precursors shown in FIG. 5, the $Al_2O_3$ precursor and the SiON precursor are effective as the precursor. A precursor is selected which satisfies the characteristics of the hard coating 1305, that is, more excellent in etching resistance than the hard mask 308, having high insulation properties and not exhibiting magnetism. In this case, the molar ratio of precursor/organic acid may be a molar ratio in consideration of the valence of the metal element corresponding to the precursor gas shown in FIG. 7 in which the organic acid gas is a monovalent acid.

In step 1204, as shown in FIG. 13C, the MgO barrier layer 305, the fixed layer 304, and the underlayer 303 are etched. The etching is preferably performed by the plasma etching having a high etching selectivity, but may also be performed by the ion beam etching. In this etching step, the stacked film composed of the MgO barrier layer 305, the fixed layer 304, and the underlayer 303 and having a total thickness of several tens of nanometers is etched, but the upper surface and the side walls of the hard mask 308 are protected by the hard coating 1305, and as a result, the effect of preventing the corner rounding of the hard mask 308 is obtained. Accordingly, it is possible to prevent a reduction in the film thickness of the hard mask 308 and to prevent a reduction in the process margin of the step (step 1206) of exposing the hard mask 308 for electrically connecting the magnetic tunnel junction with the upper electrode film in subsequent steps.

In step 1205, as shown in FIG. 13D, a protective film 1306 covering the magnetic tunnel junction is formed. The protective film 1306 is formed by a plasma CVD method. Since the side walls of the free layer 306 are covered with the hard coating 1305, it is possible to prevent deterioration of characteristics of the free layer 306 due to gases such as hydrogen, nitrogen, and oxygen or plasma produced during plasma CVD film formation. As the protective film 1306, it is desirable to form a protective film made of an insulating material such as SiN, $SiO_2$, $Al_2O_3$, $Ta_2O_5$, or $TiO_2$ because of excellent insulating properties thereof. The method of forming the protective film 1306 is not limited to the CVD method, and a sputtering method may be used.

Finally, in the step 1206, as shown in FIG. 13E, the insulating interlayer 313 is formed between the magnetic tunnel junctions, the protective film 1306 covering the upper surface of the hard mask 308 and the hard coating 1305 are removed, and the upper electrode film 314 is formed so as to be electrically connected to the hard mask 308.

In the cross-sectional structure of the magnetic tunnel junction of the present embodiment, a step 1307 is provided between the free layer 306 and the MgO barrier layer 305, and the insulating hard coating 1305 is formed on the side walls of the free layer 306. That is, the diameter of the free layer 306 is smaller than the diameter of the MgO barrier layer 305 or the fixed layer 304 by the thickness of the hard coating 1305. With this shape, it is possible to prevent the occurrence of a short-circuit failure between the free layer and the fixed layer caused by the re-attachment of the metal material etched in step 1204 to the sidewalls of the free layer 306, the MgO barrier layer 305, and the fixed layer 304.

The stacked structure of the applicable magnetic tunnel junction of the present embodiment is not limited to the magnetic tunnel junction shown in FIG. 13E. For example, in order to stabilize the magnetization direction of the free layer, a two-layer MgO film as shown in FIG. 15A may be used as a stacked structure in the magnetic tunnel junction. A lower electrode film 701, an underlayer 702, a fixed layer 703, and a MgO barrier layer 704 are the same as the corresponding layers 302 to 305 in FIG. 13A. In the stacked structure shown in FIG. 15A, instead of a single-layer free layer, a lower free layer 705 and an upper free layer 707 separated by an insertion layer 706 made of a nonmagnetic metal material such as Ta, and a MgO capping layer 708 are stacked in this order on the MgO barrier layer 704. A resist mask 710 having a prescribed pattern is formed on a hard mask 709 for element isolation.

In this case, when the MgO barrier layer 704 corresponding to the MgO barrier layer 305 in FIG. 13A is to be exposed, it is necessary to etch the stacked free layers, and it is necessary to etch the stacked film having a thickness of about 2 to 3 times that of the magnetic tunnel junction which has a single-layer free layer. Since the etching time until the MgO barrier layer 704 is exposed is increased by 2 to 3 times, the corner rounding of the hard mask 709 proceeds in this period. Thus, in a case where the stacked structure of the magnetic tunnel junction includes a plurality of MgO layers, a partial stacked film stacked above any of the MgO layers may be etched first etching the barrier layer. In this case, it is possible to minimize the corner rounding of the hard mask by first etching the partial stacked film above the uppermost MgO layer, such as the MgO capping layer 708.

A method of manufacturing the magnetic tunnel junction in this case is shown in FIG. 14 as a flowchart. In step 1401, as shown in FIG. 15A, the hard mask 709 is patterned. Subsequently, in step 1402, the upper surface and the side walls of the hard mask 709 are oxidized by exposing the magnetic tunnel junction to the oxidizing gas or the plasma using the oxidizing gas, so as to form a surface oxide layer 711 of $Ta_2O_5$ or the like as shown in FIG. 15B. Subsequent steps 1403 to 1406 are the same as steps 1203 to 1206 shown in FIG. 12, respectively. As a result, the magnetic tunnel junction shown in FIG. 15C is formed.

Fourth Embodiment

In a fourth embodiment, a case where plasma etching without using an oxidizing gas is applied or ion beam etching is applied when a stacked film is processed will be described. When these processes are applied, a surface oxide layer is not formed in a step (corresponding to step 1202 in FIG. 12 or step 1402 in FIG. 14) of etching a hard mask or a free layer of a magnetic tunnel junction. However, without the surface oxide layer 1301 (711), the formation of the hard coating 1305 (712) by the introduction of an organic acid and a precursor does not proceed. Therefore, in the present embodiment, even when a free layer is processed by the plasma etching using a gas containing no oxygen or by the ion beam etching, the surface oxide layer is formed on side walls and the upper surface of the hard mask by introducing an oxidation step after the etching.

FIG. 16 shows a process flow of a method of manufacturing the magnetic tunnel junction according to the present embodiment. The manufacture of the magnetic tunnel junction shown in FIG. 13E is described as an example, and the present embodiment is also applicable to the manufacture of the magnetic tunnel junction shown in FIG. 15C. The differences between the present embodiment and the third embodiment lie in step 1602 and step 1603.

Step 1602 is a step of etching the stacked film until the free layer by the plasma etching without using the oxidizing gas or by the ion beam etching. Since the gas containing no oxygen is used, a surface oxide layer is not formed on the upper surface and the side walls of the hard mask 308 and on the side walls the capping layer 307 and the free layer 306. In the plasma etching using the gas containing no oxygen, a reactive gas such as hydrogen or nitrogen is used, and in the ion beam etching, a rare gas such as He, Ne, Ar, Kr, or Xe or a mixed gas thereof is used.

Subsequently, the oxidation step is introduced after the etching (step 1603). By introducing this step, the surface oxide layer 1301 same as in the third embodiment can be formed on the upper surface and the side walls of the hard mask 308 and on the side walls of the capping layer 307 and the free layer 306. Specifically, by exposing the magnetic tunnel junction to the oxidizing gas or the plasma using the oxidizing gas, the upper surface and the side walls of the hard mask 308 and the side walls of the capping layer 307 and free layer 306 can be oxidized. The other steps 1601, 1604 to 1608 are the same as steps 1201, 1203 to 1206 in FIG. 12.

Thus, in the present embodiment, when the plasma etching using the gas containing no oxygen or the ion beam etching is used in the etching step of the hard mask, the oxidation step is introduced after the etching. As a result, by forming the surface oxide layer on the upper surface and the side walls of the hard mask 308 and further forming the hard coating from the surface oxide layer, corner rounding of the hard mask 308 can be reduced.

Hereinafter, a modification applicable to the process flows of the third embodiment and the fourth embodiment will be described. In step 1203 in FIG. 12, step 1403 in FIG. 14, and step 1604 in FIG. 16, the organic acid gas and the film forming seed gas are introduced simultaneously. As described in the modification of the first embodiment or the second embodiment, when the organic acid gas and the precursor gas are introduced simultaneously, the organic acid gas and the precursor gas may be directly reacted due to the combination thereof, and the combination of the organic acid gas and the precursor gas that can be introduced simultaneously is limited. In this case, it is also effective to alternately introduce the organic acid gas and the precursor gas to prevent the direct reaction between the organic acid gas and the precursor gas.

FIG. 17 shows a process flow of a method of manufacturing a magnetic tunnel junction according to the present modification. The present modification is also applicable to the manufacture of any of the magnetic tunnel junction shown in FIG. 13E and the magnetic tunnel junction shown in FIG. 15C. Step 1701 corresponds to step 1202 in FIG. 12, step 1402 in FIG. 14, and steps 1602 to 1603 in FIG. 16. Step 1702 shows a step of alternately repeating the step 1 of introducing the organic acid gas and the step 2 of introducing the precursor gas. The number of times of alternately introducing the organic acid gas and precursor gas is one or more. Accordingly, a surface oxide layer is removed, and a hard coating made of $Al_2O_3$ and the like is formed. On the other hand, the hard coating is not formed on the surface of the MgO layer. Step 1703 corresponds to step 1204 in FIG. 12, step 1404 in FIG. 14, and step 1605 in FIG. 16.

Another modification of the process flow of the method of manufacturing the magnetic tunnel junction will be described. In the third embodiment, the fourth embodiment, or the modification thereof, when the hard coating formed in the magnetic tunnel junction contains impurities such as C, the insulation and etching resistance may decrease due to the hard coating. Thus, a heat treatment is performed after the formation of the hard coating. Specifically, the heat treatment is applied to the hard coating immediately after step 1203 in FIG. 12, step 1403 in FIG. 14, or step 1604 in FIG. 16.

Therefore, the treatment time and the treatment temperature (150° C. to 400° C.) under which the impurity reduction of the hard coating is promoted are set, and the magnetic tunnel junction covered with the hard coating is heated at 400° C. for 30 minutes, for example. With this heating step, the impurities such as C can be reduced, and the insulation property of the hard coating can be enhanced. In addition, by reducing the impurities, the crystallinity of the hard coating can be increased, and the etching resistance of the hard coating can be improved. When the magnetic tunnel junction is heated at a temperature higher than 400° C., the magnetic properties may deteriorate, and therefore, this heating step is preferably performed at 400° C. or lower. As the heat treatment method, a method of directly heating the substrate by a heater, heating the substrate by infrared light or laser light irradiation, heating the substrate by plasma, or the like can be applied.

In order to improve the insulating property and the etching resistance of the hard coating 1305 (712), the heat treatment may be performed in an atmosphere using a reactive gas such as oxygen or nitrogen. When the reactive gas and the exposed MgO barrier layer 305 (the MgO capping layer 708) are reacted, the reaction product is limited to the surface of the MgO barrier layer 305 (MgO capping layer 708) and is then removed in the subsequent etching step, so that the characteristics of the magnetic tunnel junction are not influenced. Thus, by introducing the heat treatment after the hard coating 1305 is formed, the insulating property and the etching resistance of the hard coating 1305 can be improved.

The invention made by the present inventor is described above in detail based on the embodiments, but the invention is not limited to the above embodiments, and various changes can be made within the scope not departing from the gist of the invention. In addition, the plurality of illustrated configuration examples and modifications may be used in combination as long as no contradiction arises. For example, by combining the first embodiment or the second embodiment with the third embodiment or the fourth embodiment, it is possible to protect the magnetic layer while suppressing the corner rounding of the hard mask. Also, the exemplified materials are merely examples, and other materials compatible with the requirements shown in the embodiments may be used. For example, although the example using MgO as the barrier layer of the magnetic tunnel junction has been shown, ZnO and $Al_2O_3$ can also be used as the barrier layer. When the materials are used, conditions under which the barrier layer is not deteriorated can be relaxed compared to the case of MgO, and for example, the pressure in the chamber can be set within a range of 0.1 Pa to $1e^5$ Pa, and the treatment temperature thereof can be set within a range of 0 to 400° C. In addition, since the deliquescent property with respect to $H_2O$ is not shown, the molar ratio of the organic acid gas to the precursor gas can be set as desired.

REFERENCE SIGN LIST

101 Si substrate
102 lower electrode film
103 underlayer
104 fixed layer
105 MgO barrier layer
106 free layer
107 capping layer
108 hard mask
109 protective film
110 magnetic oxide layer
301 Si substrate
302, 701 lower electrode film
303, 702 underlayer
304, 703 fixed layer
305, 704 MgO barrier layer
306 free layer
307 capping layer
308, 709 hard mask
309, 710 resist mask
310 magnetic oxide layer
311 first protective film
312 second protective film
313, 714 insulating interlayer
314, 715 upper electrode film
705 lower free layer
706 insertion layer
707 upper free layer 708 capping layer
711, 1301 surface oxide layer
712, 1305 hard coating
713, 1306 protective film
1307 step

The invention claimed is:

1. A method of manufacturing a magnetic tunnel junction, comprising:
- a first step of etching a stacked film including a first magnetic layer, a second magnetic layer, and a barrier layer disposed between the first magnetic layer and the second magnetic layer by plasma etching using a gas except for an oxidizing gas or by ion beam etching using a gas except for an oxidizing gas to form the magnetic tunnel junction;
- a second step of oxidizing side walls of the magnetic tunnel junction;
- a third step of introducing an organic acid gas which is an n-valent acid and a precursor gas whose valence of a corresponding metal element is m into a chamber for forming the magnetic tunnel junction, to form a first protective film on the side walls of the magnetic tunnel junction after the second step, wherein
- n and m are natural numbers, and
- a molar ratio of the precursor gas to the organic acid gas is greater than or equal to n/m.

2. The method of manufacturing a magnetic tunnel junction according to claim 1, further comprising:
- a forth step of forming, by a plasma CVD method, a second protective film on the magnetic tunnel junction on which the first protective film is formed.

* * * * *